United States Patent
Ichikawa

(10) Patent No.: US 11,069,716 B2
(45) Date of Patent: *Jul. 20, 2021

(54) GLASS SUBSTRATE FOR DISPLAY AND METHOD FOR PRODUCING SAME

(71) Applicant: AvanStrate Inc., Tokyo (JP)

(72) Inventor: Manabu Ichikawa, Yokkaichi (JP)

(73) Assignee: AvanStrate Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/740,906

(22) PCT Filed: Jun. 28, 2016

(86) PCT No.: PCT/JP2016/069145
§ 371 (c)(1),
(2) Date: Dec. 29, 2017

(87) PCT Pub. No.: WO2017/002808
PCT Pub. Date: Jan. 5, 2017

(65) Prior Publication Data
US 2018/0190675 A1  Jul. 5, 2018

(30) Foreign Application Priority Data
Jun. 30, 2015 (JP) .............................. JP2015-131780

(51) Int. Cl.
| | |
|---|---|
| *H01L 27/12* | (2006.01) |
| *C03C 3/091* | (2006.01) |
| *C03B 5/027* | (2006.01) |
| *C03B 25/08* | (2006.01) |
| *H01L 29/786* | (2006.01) |

(Continued)

(52) U.S. Cl.
CPC .......... *H01L 27/1218* (2013.01); *C03B 5/027* (2013.01); *C03B 17/064* (2013.01); *C03B 25/04* (2013.01); *C03B 25/08* (2013.01); *C03C 3/091* (2013.01); *C03C 3/093* (2013.01); *H01L 27/1222* (2013.01); *H01L 27/1225* (2013.01); *H01L 27/1262* (2013.01); *H01L 29/7869* (2013.01); *H01L 29/78603* (2013.01); *H01L 29/78672* (2013.01); *H01L 29/78675* (2013.01); *G02F 1/1368* (2013.01);

(Continued)

(58) Field of Classification Search
CPC ....... C03B 17/064; C03B 25/04; C03B 5/027; C03C 3/085; C03C 3/087; C03C 3/091; C03C 3/093; G02F 1/1368; G02F 2001/133302; G02F 2202/104; H01L 27/1218; H01L 27/1222; H01L 27/1225; H01L 27/1262; H01L 27/3262; H01L 29/78603; H01L 29/78672; H01L 29/78675; H01L 29/7869; Y02P 40/57

See application file for complete search history.

(56) References Cited

U.S. PATENT DOCUMENTS

| | | | | |
|---|---|---|---|---|
| 8,187,715 | B2 * | 5/2012 | Danielson | ............... C03C 17/06 |
| | | | | 428/432 |
| 8,652,979 | B2 * | 2/2014 | Murata | ................... C03C 3/093 |
| | | | | 501/68 |

(Continued)

FOREIGN PATENT DOCUMENTS

| | | |
|---|---|---|
| CN | 101400614 A | 4/2009 |
| CN | 103910487 A | 7/2014 |

(Continued)

OTHER PUBLICATIONS

International Search Report dated Aug. 2, 2016 issued by the International Searching Authority in International application No. PCT/JP2016/069145.
International Preliminary Report on Patentability with the translation of Written Opinion dated Jan. 11, 2018 issued by the International Bureau in International Application No. PCT/JP2016/069145.
Communication dated Jul. 11, 2019, from the Intellectual Property Office of Taiwan in counterpart Application No. 105120827.
Communication dated Sep. 29, 2019, issued by the State Intellectual Property Office of the P.R.C. in corresponding Chinese Application No. 201680037857.8.

(Continued)

*Primary Examiner* — Mohammed Shamsuzzaman
(74) *Attorney, Agent, or Firm* — Sughrue Mion, PLLC

(57) ABSTRACT

Provided are: a glass substrate that achieves a high strain point while having a low devitrification temperature; and a method for producing said glass substrate. This glass substrate for a display is made of a glass comprising $SiO_2$ and $Al_2O_3$, comprising 0% or more to less than 3% $B_2O_3$ and from 5 to 14% BaO in mass %, and substantially devoiding $Sb_2O_3$, wherein the devitrification temperature is 1235° C. or lower and the strain point is 720° C. or higher. Alternatively, this glass substrate for a display is made of a glass comprising $SiO_2$ and $Al_2O_3$, comprising 0% or more to less than 3% $B_2O_3$, 1.8% or more MgO, and from 5 to 14% BaO in mass %, and substantially devoiding $Sb_2O_3$, wherein $(SiO_2+MgO+CaO)-(Al_2O_3+SrO+BaO)$ is less than 42%, the devitrification temperature is 1260° C. or lower, and the strain point is 720° C. or higher. This method for producing said glass substrate for a display comprises: a melting step for melting, by using at least direct electrical heating, a glass material prepared to have a predetermined composition; a forming step for forming, into a flat glass sheet, the molten glass that has been melted in the melting step; and an annealing step for annealing the flat glass sheet, wherein a condition for cooling the flat glass sheet is controlled so as to reduce the heat shrinkage rate of the flat glass sheet.

12 Claims, No Drawings

(51) Int. Cl.
   *C03B 17/06*   (2006.01)
   *C03B 25/04*   (2006.01)
   *C03C 3/093*   (2006.01)
   *G02F 1/1333*   (2006.01)
   *G02F 1/1368*   (2006.01)
   *H01L 27/32*   (2006.01)

(52) U.S. Cl.
   CPC .. *G02F 1/133302* (2021.01); *G02F 2202/104* (2013.01); *H01L 27/3262* (2013.01); *Y02P 40/57* (2015.11)

(56) References Cited

U.S. PATENT DOCUMENTS

| | | | | |
|---|---|---|---|---|
| 8,679,631 | B2* | 3/2014 | Murata | C03C 3/083 428/410 |
| 9,598,307 | B2* | 3/2017 | Miwa | C03C 3/095 |
| 9,809,486 | B2* | 11/2017 | Murata | C03C 21/002 |
| 2005/0090377 | A1* | 4/2005 | Shelestak | C03C 3/087 501/69 |
| 2008/0206494 | A1* | 8/2008 | Kurachi | C03C 3/091 428/1.62 |
| 2009/0270242 | A1* | 10/2009 | Yanase | C03C 3/091 501/67 |
| 2010/0035745 | A1* | 2/2010 | Murata | C03C 3/097 501/66 |
| 2010/0137122 | A1* | 6/2010 | Nagai | C03C 3/087 501/70 |
| 2013/0059718 | A1* | 3/2013 | Koyama | C03C 3/091 501/66 |
| 2013/0324389 | A1* | 12/2013 | Nagashima | C03C 3/087 501/66 |
| 2015/0004390 | A1* | 1/2015 | Kawamoto | C03C 3/087 428/220 |
| 2018/0148367 | A1* | 5/2018 | Hayashi | H01L 27/32 |
| 2018/0186684 | A1* | 7/2018 | Ichikawa | C03C 3/091 |

FOREIGN PATENT DOCUMENTS

| | | |
|---|---|---|
| JP | H04-175242 A | 6/1992 |
| JP | 2004-315354 A | 11/2004 |
| JP | 2009-525942 A | 7/2009 |
| JP | 2010-6649 A | 1/2010 |
| JP | 2011-126728 A | 6/2011 |
| JP | 2012-106919 A | 6/2012 |
| JP | 2012-184146 A | 9/2012 |
| JP | 2015-71523 A | 4/2015 |
| JP | 2015-512849 A | 4/2015 |
| JP | 2015516930 A | 6/2015 |
| WO | 2007/095115 A1 | 8/2007 |
| WO | 2012/063643 A1 | 5/2012 |
| WO | 2012/108345 A1 | 8/2012 |
| WO | 2013/130695 A1 | 9/2013 |
| WO | 2013130665 A2 | 9/2013 |
| WO | 2015072429 A1 | 5/2015 |

OTHER PUBLICATIONS

Communication dated Jan. 7, 2020 from Japanese Patent Office in JP Application No. 2017-526371.
Communication dated Jun. 24, 2020 from the Korean Intellectual Property Office in Application No. 10-2018-7002478.
Communication dated Feb. 21, 2020 from the Intellectual Property of India in application No. 201847002506.
Communication dated Dec. 18, 2020 from the Korean Intellectual Property Office issued in corresponding Korean Application No. 10-2018-7002478.
Communication dated Jan. 25, 2021 from the Indian Patent Office issued in corresponding Indian Application No. 201847002506.
Office Action dated Feb. 5, 2021 from the China National Intellectual Property Administration in CN Application No. 201810967486.4.
Communication dated Apr. 16, 2021, from the State Intellectual Property Office of the P.R. of China in Application No. 201680037857.8.

* cited by examiner

GLASS SUBSTRATE FOR DISPLAY AND METHOD FOR PRODUCING SAME

TECHNICAL FIELD

The present invention relates to a glass substrate for a display and a method for producing the same. Particularly, the present invention relates to a glass substrate for a low-temperature-polysilicon thin-film-transistor (hereinafter referred to as LTPS-TFT) display. The present invention also relates to a glass substrate for an oxide-semiconductor thin-film-transistor (hereinafter referred to as OS-TFT) display. More specifically, the present invention relates to a glass substrate for a display, wherein the display is a liquid crystal display. Alternatively, the present invention relates to a glass substrate for a display, wherein the display is an organic EL display. Further, the present invention relates to a glass substrate for a flat panel display, wherein the display is a flat panel display.

CROSS REFERENCE TO RELATED APPLICATIONS

The present application claims priority to Japanese Patent Application No. 2015-131780 filed on 30 Jun. 2015, which is entirely incorporated herein by reference.

BACKGROUND ART

Displays incorporated in mobile devices and the like employ LTPS for producing thin film transistors (TFTs) for reasons such as reducing power consumption. However, the production of LTPS-TFTs requires a heat treatment at relatively high temperatures of 400° C. to 600° C. In recent years, a higher degree of definition is demanded of displays for small devices. Thus, heat shrinkage of glass substrates during production of display panels, which is a cause of unevenness in pixel pitch, has been an issue. It has also been desired to inhibit heat shrinkage of glass substrates onto which OS-TFTs are formed.

The heat shrinkage rate of a glass substrate can be generally reduced by increasing the strain point of glass, increasing the glass transition point (hereinafter referred to as Tg) or reducing the annealing rate. Based on such circumstances, a technique for reducing the heat shrinkage is disclosed by increasing the strain point of glass (PTL 1). Another technique for reducing heat shrinkage disclosed is to adjust the ratio between the gradient of the average density curve and the average coefficient of linear expansion in the temperature range from the annealing point to around the strain point (PTL 2). A technique for reducing the heat shrinkage rate by increasing Tg is also disclosed (PTL 3). In recent years, a higher degree of definition is demanded of display panels, and thus the reduction in the heat shrinkage rate according to the technique disclosed in PTL 3 becomes insufficient. Because of this, a technique for configuring the strain point of glass to be 725° C. or higher is also disclosed (PTL 4).

CITATION LIST

Patent Literature (PTL)

[PTL 1] Japanese Patent Application Publication No. 2010-6649
[PTL 2] Japanese Patent Application Publication No. 2004-315354
[PTL 3] Japanese Patent Application Publication No. 2011-126728
[PTL 4] Japanese Patent Application Publication No. 2012-106919

The disclosures in PTL 1 to 4 are entirely incorporated herein by reference.

SUMMARY OF INVENTION

Technical Problem

In recent years, a higher degree of definition is demanded, and thus there is a demand for further decreasing the heat shrinkage rate. When the strain point of a glass substrate is increased in order to decrease the heat shrinkage, an increase in the contents of $SiO_2$ and $Al_2O_3$ in glass is required, which tends to cause an increase in the specific resistance of molten glass. In recent years, direct electrical heating may be employed for the efficient melting of glass in a melting tank in some cases. In the case of direct electrical heating, it has been found that an increase in the specific resistance of molten glass may cause electric current to pass through refractory materials constituting a melting tank rather than through the molten glass and this may give rise to a problem that the melting tank is subjected to erosion and wear. The invention disclosed in PTL 1, however, does not take into consideration the specific resistance of the molten glass. Thus, there is a strong concern that, if the glass disclosed in PTL 1 is produced through melting by direct electrical heating, the aforementioned problem regarding the erosion/wear of the melting tank may occur. Further, the above problem is more significant because a higher degree of definition is demanded in recent years, and thus there is a demand for further increasing the strain point of glass.

As the glass disclosed in PTL 2 has the strain point of 682° C. to 699° C., the annealing rate is required to be extremely low in order to obtain the gradient of the average density curve that causes heat shrinkage to be sufficiently low, and this gives rise to a problem of reduction in productivity. Further, the glass disclosed in PTL 2 has a devitrification temperature of 1287° C. or above, and thus is prone to generate devitrification. The above problems are particularly significant when forming is carried out by down-draw processing.

Further, an increase in productivity during manufacture of displays containing glass substrates is demanded and it is also demanded to increase productivity of the process of, for example, thinning a glass substrate onto which a thin film transistor is formed. The productivity of the process for thinning the glass substrate significantly depends on the time required for etching of the glass substrate. Therefore, it is required for a display glass substrate to achieve both an increased productivity by increasing the etching rate and a reduction in the heat shrinkage rate. Although the glass substrate disclosed in PTL 4 has high strain point, the etching rate is not taken into account.

Thus, an object of the present invention is to provide a glass substrate having low devitrification temperature while fulfilling high strain point and a method for producing the same. Particularly, an object of the present invention is to provide a glass substrate for a display suitable for a display containing a LTPS-TFT or OS-TFT and a method for producing the same.

Solution to Problem

The present invention encompasses the following:

[1] A glass substrate for a display composed of a glass,
the glass comprising $SiO_2$ and $Al_2O_3$; and
the glass further comprising, in % by mass, $B_2O_3$ at 0% or more and less than 3%; and BaO at 5% to 14%;
being substantially devoid of $Sb_2O_3$;
having a devitrification temperature of 1235° C. or lower; and
having a strain point of 720° C. or higher.

[2] A glass substrate for a display composed of a glass,
the glass comprising $SiO_2$ and $Al_2O_3$;
the glass further comprising, in % by mass, $B_2O_3$ at 0% or more and less than 3%;
MgO at 1.8% or more; and BaO at 5% to 14%;
being substantially devoid of $Sb_2O_3$;
having $(SiO_2+MgO+CaO)-(Al_2O_3+SrO+BaO)$ of less than 42%;
having a devitrification temperature of 1260° C. or lower; and
having a strain point or 720° C. or higher.

[3] The glass substrate according to any one of [1] to [2], wherein the glass substrate has a heat shrinkage rate of 15 ppm or less, the heat shrinkage rate being represented by the following formula when the glass substrate is kept at a temperature of 500° C. for 30 minutes followed by cooling to normal temperature: Heat shrinkage rate (ppm)={Amount of shrinkage of glass before and after heat treatment/Length of glass before heat treatment}×10⁶.

[4] The glass substrate according to any one of [1] to [3], wherein the glass substrate has an etching rate of higher than 75 μm/h.

[5] The glass substrate according to any of [1] to [4], which is a glass substrate for a flat panel display comprising a thin film transistor formed with a low-temperature polysilicon or an oxide semiconductor on the surface of the glass substrate.

[6] A method for producing the glass substrate for a display according to any one of [1] to [5], comprising:
a melting step of melting glass raw materials blended according to a predetermined composition by employing at least direct electrical heating;
a forming step of forming a molten glass melted in the melting step into a flat-plate glass; and
an annealing step of annealing the flat-plate glass, with a cooling condition of the flat-plate glass being controlled so as to reduce a heat shrinkage rate of the flat-plate glass.

Advantageous Effects of Invention

According to the glass substrate of the present invention, it is possible to produce a glass substrate having low devitrification temperature while fulfilling high strain point. Accordingly, it is possible to provide a glass substrate for a display having reduced heat shrinkage during production of the display, particularly a glass substrate for a display suitable for a flat panel display containing a LTPS-TFT or an OS-TFT.

DESCRIPTION OF EMBODIMENTS

In the present specification, the composition of glass is, unless otherwise stated, expressed in % by mass and the content represented by "%" means "% by mass". The ratio between components that constitute a glass composition is expressed in mass ratio.

The glass substrate for a display (first embodiment) of the present invention is composed of a glass,
the glass comprising $SiO_2$ and $Al_2O_3$;
the glass further comprising, in % by mass, $B_2O_3$ at 0% or more and less than 3%; and BaO at 5% to 14%;
being substantially devoid of $Sb_2O_3$;
having a devitrification temperature of 1235° C. or lower; and
having a strain point of 720° C. or higher.

The glass substrate for a display (second embodiment) of the present invention is composed of a glass,
the glass comprising $SiO_2$ and $Al_2O_3$;
the glass further comprising, in % by mass, $B_2O_3$ at 0% or more and less than 3%;
MgO at 1.8% or more; and BaO at 5% to 14%;
being substantially devoid of $Sb_2O_3$;
having $(SiO_2+MgO+CaO)-(Al_2O_3+SrO+BaO)$ of less than 42%;
having a devitrification temperature of 1260° C. or lower; and
having a strain point of 720° C. or higher.

The glass substrate for a display of the present embodiments are hereinafter described. Unless otherwise stated, the following descriptions apply to both the first and second embodiments of the present invention.

The glass constituting the glass substrate for a display of the present invention contains $SiO_2$ and $Al_2O_3$.

$SiO_2$ is a skeletal component of glass, and is thus an essential component. If the content is low, there are tendencies that the strain point decreases and the coefficient of thermal expansion increases. If the $SiO_2$ content is too low, it becomes difficult to reduce the density of the glass substrate. On the other hand, if the $SiO_2$ content is too high, there are tendencies that the specific resistance of molten glass increases, the melting temperature significantly increases and melting becomes difficult. If the $SiO_2$ content is too high, the etching rate becomes low. From such standpoints, the $SiO_2$ content may be appropriately adjusted. The $SiO_2$ content of the glass is, for example, in the range of preferably 45% to 80%. The content of $SiO_2$ is more preferably in the range of 50% to 75% or 50% to 70%, still more preferably 52% to 68% and even more preferably 55% to 65%.

$Al_2O_3$ is an essential component that increases the strain point. If the $Al_2O_3$ content is too low, the strain point decreases. Further, if the $Al_2O_3$ content is too low, there are tendencies that the Yong's modulus and the rate of etching using acid also decrease. On the other hand, if the $Al_2O_3$ content is too high, the devitrification temperature of glass increases and the devitrification resistance decreases, and thus formability tends to deteriorate. From such standpoints, the content may be appropriately adjusted. The $Al_2O_3$ content of the glass is in the range of, for example, 10% to 35%. The $Al_2O_3$ content is in the range of preferably 13% to 30%, more preferably 15% to 25%, still more preferably 15% to 23% and even more preferably 16% to 22%.

$B_2O_3$ is a component that reduces the viscosity at high temperatures of glass and improves meltability. Namely, the component reduces the viscosity in the vicinity of the melting temperature, thereby improving meltability. The component also reduces the devitrification temperature. If the $B_2O_3$ content is too low, there are tendencies that the meltability and the devitrification resistance deteriorate. If the $B_2O_3$ content is too high, the strain point and the Young's modulus decrease. Due to the volatilization of $B_2O_3$ during glass formation, devitrification is prone to occur. Particularly, glass having a high strain point tends to have high formation temperature, and thus the volatilization is promoted and the occurrence of devitrification causes a significant problem. Due to volatilization of $B_2O_3$ during glass melting, the glass becomes significantly nonuniform and striate are prone to occur. From such standpoints, the $B_2O_3$ content is 0% or more and less than 3%. The $B_2O_3$ content is in the range of preferably 0% to 2.8%, more preferably 0% to 2.6%, still more preferably 0.1% to 2.4%, even more preferably 0.3% to 2.2% and yet more preferably 0.5% to 2.0%.

MgO is a component that increases meltability and is an essential component in the second embodiment of the present invention. MgO is also a component that hardly increases the density among other alkaline earth metals, and thus if the content thereof is relatively increased, the density may be easily decreased. Inclusion thereof may decrease the specific resistance and melting temperature of molten glass. However, if the MgO content is too high, the devitrification temperature of glass sharply increases, thereby frequently causing devitrification particularly in the forming step. From such standpoints, in the second embodiment of the present invention, the MgO content is in the range of 1.8% to 15%, preferably 1.8% to 13%, more preferably 1.9% to 10% and still more preferably 1.9% to 7%. In the first embodiment of the present invention, the MgO content is in the range of preferably 0% to 15%, more preferably 0% to 13% and still more preferably 0% to 10%.

CaO is a component that is not essential, but is efficient for improving meltability of glass without sharply increasing the devitrification temperature of the glass. CaO is also a component that hardly increases the density among other alkaline earth metal oxides, and thus if the content thereof is relatively increased, the density may be easily decreased. If the content is too low, there are tendencies that the specific resistance of molten glass increases and the devitrification resistance decreases. If the CaO content is too high, there are tendencies that the coefficient of thermal expansion increases and the density increases. From such standpoints, the CaO content is in the range of preferably 0% to 20%, more preferably 0% to 15% and still more preferably 0% to 10%.

SrO is a component that may decrease the devitrification temperature of glass. Although SrO is not essential, inclusion thereof improves devitrification resistance and meltability. However, if the SrO content is too high, the density increases. From such standpoints, the SrO content is in the range of 0% to 15%, preferably 0% to 10%, more preferably 0% to 7%, still more preferably 0% to 5% and even more preferably 0% to 3%.

BaO is an essential component that can effectively reduce the devitrification temperature of glass and the specific resistance of molten glass. Inclusion of BaO improves devitrification resistance and meltability. However, if the BaO content is too high, the density increases. From the standpoints of environmental load and the tendency of increasing the coefficient of thermal expansion, the BaO content is in the range of 5% to 14%. The BaO content is in the range of preferably 6% to 13.5%, more preferably 7% to 13%, still more preferably 8% to 12% and even more preferably 8.5% to 12%.

MgO, CaO, SrO and BaO are components that reduce the specific resistance and melting temperature of molten glass and improve meltability. If the total content of MgO, CaO, SrO and BaO, MgO+CaO+SrO+BaO (hereinafter referred to as RO), is too low, meltability deteriorates. If RO is too high, the strain point and the Young's modulus decrease and the density and the coefficient of thermal expansion increase.

From such standpoints, RO is in the range of preferably 5% to 35%, more preferably 9% to 30%, still more preferably 10% to 27% and even more preferably 12% to 25%.

$Li_2O$ and $Na_2O$ are components that may increase the coefficient of thermal expansion of glass and damage the substrate during heat treatment. The components also reduce the strain point. Meanwhile, the components may reduce the specific resistance of molten glass, thus can inhibit erosion of a melting tank by including the same. From such standpoints, the $Li_2O$ content is preferably 0% to 0.5% and more preferably $Li_2O$ is not substantially included. The $Na_2O$ content is preferably 0% to 0.5% and more preferably 0% to 0.2%. As $Na_2O$ is a component that reduces the strain point less than $Li_2O$ does, it is preferable that $Na_2O>Li_2O$. From the standpoint of preventing elution from the glass substrate to cause deterioration of TFT properties, it is preferable that $Li_2O$ and $Na_2O$ are not substantially included.

$K_2O$ is a component that increases the basicity of glass and promotes refinability. The component also reduces the specific resistance of molten glass. Inclusion thereof reduces the specific resistance of molten glass, thereby enabling prevention of electric current flowing through refractory materials forming a melting tank and erosion of the melting tank. If refractory materials forming a melting tank include zirconia, elution of zirconia may be inhibited from the melting tank to molten glass by erosion of the melting tank, and thus devitrification due to zirconia may also be inhibited. The component may also reduce the viscosity of glass in the vicinity of the melting temperature, thereby improving meltability and refinability. If the $K_2O$ content is too high, there are tendencies that the coefficient of thermal expansion increases and the strain point decreases. From such standpoints, the $K_2O$ content is in the range of preferably 0% to 0.8%, more preferably 0.01% and 0.6% and still more preferably 0.1% to 0.5%.

$Li_2O$, $Na_2O$ and $K_2O$ are components that increase the basicity of glass, facilitate the oxidation of refining agents and allow manifestation of refinability. The components also reduce the viscosity at the melting temperature and improve meltability. The components also reduce the specific resistance of molten glass. Inclusion of $Li_2O$, $Na_2O$ and $K_2O$ reduces the specific resistance of molten glass and improves refinability and meltability. The components may particularly prevent excess electric current flowing through refractory materials forming a melting tank and inhibit erosion of the melting tank. If the melting tank is formed with zirconia, the components may inhibit elution of zirconia from a melting tank to glass, and thus may inhibit devitrification due to zirconia. The components also reduce the viscosity of molten glass and thus may improve meltability and refinability. However, if the total content of $Li_2O$, $Na_2O$ and $K_2O$ is too high, the components may elute from the glass substrate to deteriorate TFT properties. There are also tendencies that the strain point decreases and the coefficient of thermal expansion increases. The total content of $Li_2O$, $Na_2O$ and $K_2O$ (hereinafter referred to as $R_2O$) is preferably 1.0% or less, more preferably 0.01% to 1.0%, still more preferably 0.01% to 0.8% and even more preferably 0.1% to 0.5%.

$ZrO_2$ and $TiO_2$ are components that improve the strain point of glass. However, if the amount of $ZrO_2$ and the amount of $TiO_2$ are too high, the devitrification temperature significantly increases and devitrification resistance tends to decrease. Particularly, $ZrO_2$ has a high melting point and is practically insoluble, and thus may cause a problem of deposition of some raw materials at the bottom of a melting tank. The non-melting components mixed in a glass body may become an inclusion and impair the quality of glass. $TiO_2$ is a component that causes tinting of glass, and thus is not preferable to be included in substrates for displays. From such standpoints, the glass substrate of the present embodiments contains $ZrO_2$ and $TiO_2$ in the range of 0% to 10% and more preferably 0% to 5%, respectively, and still more preferably does not substantially include $ZrO_2$ or $TiO_2$.

ZnO is a component that improves meltability. However, the component is not essential. If the ZnO content is too high, there are tendencies that the devitrification temperature increases, the strain point decreases and the density increases. From such standpoints, the ZnO content is in the range of preferably 0% to 5% and more preferably 0% to 2% and still more preferably the glass substrate does not substantially include ZnO.

The glass substrate of the present embodiments may contain a refining agent. The refining agent is not particularly limited as far as the refining agent has a small environmental load and excellent refinability of glass. Examples thereof include at least one selected from the group of metal oxides of Sn, Fe, Ce, Tb, Mo and W. The glass substrate of the present embodiments does not substantially contain $Sb_2O_3$. By being substantially devoid of $Sb_2O_3$, the environmental load may be reduced. $SnO_2$ is suitable as a refining agent. If the content of the refining agent is too low, the quality of bubbles deteriorates. If the content is too high, the component may cause devitrification or tinting. The content of the refining agent may also depend on the type of the refining agent and the glass composition. For example, the total content of $SnO_2$ and $Fe_2O_3$ is preferably 0.05% to 0.50% and more preferably 0.05% to 0.40%.

$SnO_2$ is a refining agent that exhibits a refining effect even at 1600° C. or higher and is one of few refining agents that may be used for production of a glass substrate for a flat panel display which can contain only minute amounts of $Li_2O$, $Na_2O$ and $K_2O$ (for example, the total content of $Li_2O$, $Na_2O$ and $K_2O$ is 0.01% to 0.8%). However, $SnO_2$ is a component that may easily cause devitrification spontaneously and promotes devitrification of other components. From the standpoint of inhibiting devitrification, it is not preferable to add a high level of $SnO_2$.

Glass having a high strain point (for example, glass having a strain point of 720° C. or higher) tends to have a higher devitrification temperature than glass having a low strain point (for example, glass having a strain point of less than 720° C.). Therefore, in order to inhibit devitrification, the temperature of molten glass in the forming step may have to be increased compared to glass having a low strain point, in some cases. Meanwhile, it is preferable that a forming device used in the overflow down-draw processing is formed with refractory materials including zirconia from the standpoint of creep resistance and heat resistance. If the forming method employed is overflow down-draw, the temperature of the forming device is required to be increased in order to increase the temperature of molten glass in the forming step. However, if the forming device has an increased temperature, zirconia may elute from the forming device and may cause devitrification of zirconia. There are also tendencies that in glass containing particularly a high level of $SnO_2$, devitrification of $SnO_2$ due to zirconia and devitrification of zirconia due to $SnO_2$ occur.

Further, glass having a high strain point (for example, glass having a strain point of 720° C. or higher) tends to have a higher temperature during melting of glass raw materials than glass having a low strain point (for example, glass having a strain point of less than 720° C.). Meanwhile, a melting tank for performing a melting step is preferably formed with high-zirconia-content refractory materials containing zirconia from the standpoint of erosion resistance. Also from the standpoint of energy efficiency, glass raw materials are preferably melted by an electrical melting process or an electrical melting process combined with another heating means. However, when glass having a high strain point and containing only minute amounts of $Li_2O$, $Na_2O$ and $K_2O$ as described in the present embodiments are melted, the molten glass has high specific resistance and thus may allow electric current to flow through the high-zirconia-content refractory material and elution of zirconia into the molten glass. If zirconia is eluted, there are tendencies that devitrification of zirconia and devitrification of $SnO_2$ described above occur.

Namely, from the standpoint of inhibiting devitrification of zirconia and $SnO_2$, it is not preferable that the glass substrate of the present embodiments contains above 0.8% of $SnO_2$. From such a standpoint, the $SnO_2$ content is in the range of, for example, preferably 0.01% to 0.8% inclusive, more preferably 0.02% to 0.6%, still more preferably 0.05% to 0.50% and even more preferably 0.05% to 0.40%.

$Fe_2O_3$ is a component that, in addition to serving as a refining agent, reduces the specific resistance of molten glass. Glass having a high high-temperature viscosity and having a difficulty in melting preferable to contain $Fe_2O_3$ in order to decrease the specific resistance of molten glass. However, if the $Fe_2O_3$ content is too high, glass is tinted and the transmittance decreases. Therefore, the $Fe_2O_3$ content is in the range of 0% to 0.1%, preferably 0% to 0.08%, more preferably 0.001% to 0.06%, still more preferably 0.001% to 0.05% and even more preferably 0.001% to 0.04%.

In the present embodiments, it is preferable that the refining agent used is a combination of $SnO_2$ and $Fe_2O_3$. From the standpoint of inhibition of devitrification, it is not preferable that the content of $SnO_2$ is high, as described above. However, in order to have a sufficient refining effect, it is required to include a certain amount or more refining agent. By combining $SnO_2$ and $Fe_2O_3$, glass substrate with less bubbles may be produced with sufficient refining effect without increasing the $SnO_2$ content to the level that causes devitrification. The total content of $SnO_2$ and $Fe_2O_3$ is in the range of preferably 0.05% to 0.50%, more preferably 0.05% to 0.45% and still more preferably 0.05% to 0.40%.

If the mass ratio ($SnO_2/(SnO_2+Fe_2O_3)$) of the $SnO_2$ content relative to the total content of $SnO_2$ and $Fe_2O_3$ is too high, devitrification is prone to occur and if the mass ratio is too low, a sufficient refining effect may not be obtained and glass may be tinted. Therefore, the mass ratio is in the range of preferably 0.6 to 1.0 and more preferably 0.7 to 0.98.

It is preferable that the glass substrate of the present embodiments does not substantially contain $As_2O_3$ from the standpoint of environmental load. The glass substrate of the present embodiments does not substantially contain $Sb_2O_3$ from the standpoint of environmental load.

It is preferable that the glass substrate of the present embodiments does not substantially contain PbO or F from environmental reasons.

As used herein, the phrase "does not substantially contain" or the like means that a substance that serves as a raw material of the component in question is not used as a glass raw material, and does not exclude contamination of the component in question as an impurity from a glass raw material for another component or of the component in question into glass from a production equipment such as a melting tank and a forming device.

If the value of the difference between the $SiO_2$ content and a quarter of the $Al_2O_3$ content, $SiO_2$-($\frac{1}{4} \times Al_2O_3$), is too high, the etching rate may decrease. From such a standpoint, $SiO_2$-($\frac{1}{4} \times Al_2O_3$) is 65 or less. On the other hand, if the value of $SiO_2$-($\frac{1}{4} \times Al_2O_3$) is too low, devitrification resistance may decrease. From such a standpoint, $SiO_2$-($\frac{1}{4} \times Al_2O_3$) is preferably 40% to 65%, more preferably 45% to 60% and still more preferably 50% to 55%.

The difference between the total content of $SiO_2$, MgO and CaO and $Al_2O_3$, SrO and BaO, ($SiO_2$+MgO+CaO)—($Al_2O_3$+SrO+BaO), serves as an index of the etching rate. If the value is too high, the etching rate decreases. On the other hand, if the value is too low, devitrification resistance decreases. From such standpoints, ($SiO_2$+MgO+CaO)—($Al_2O_3$+SrO+BaO) is in the range of preferably less than 42%, more preferably 41% or less, still more preferably 25% to 41% and even more preferably 30% to 40%.

The mass ratio ($SiO_2$+$Al_2O_3$)/($B_2O_3$+RO) serves as indexes of mainly the strain point and devitrification resistance. If the value is too low, the strain point decreases. On the other hand, if the value is too high, meltability and devitrification resistance decrease. Therefore, the mass ratio ($SiO_2$+$Al_2O_3$)/($B_2O_3$+RO) is in the range of preferably 1 to 8, more preferably 2 to 7, still more preferably 2.5 to 6.5 and even more preferably 3 to 6.

$B_2O_3$+RO+ZnO serves as an index of mainly meltability. If the value is too low, meltability decreases. On the other hand, if the value is too high, the strain point decreases and the coefficient of thermal expansion increases. From such standpoints, $B_2O_3$+RO+ZnO is in the range of preferably 5% to 35%, more preferably 9% to 30%, still more preferably 12% to 28% and even more preferably 15% to 25%.

If the total content of $SiO_2$ and $Al_2O_3$, $SiO_2$+$Al_2O_3$, iS too low, the strain point tends to decrease and if the total content is too high, devitrification resistance tends to deteriorate. Therefore, $SiO_2$+$Al_2O_3$ is in the range of preferably 70% to 90%, preferably 73% to 88%, more preferably 75% to 85% and still more preferably 77% to 83%.

The mass ratio $B_2O_3$/($SiO_2$+$Al_2O_3$) serves as indexes of mainly meltability, devitrification resistance and the strain point. If $B_2O_3$/($SiO_2$+$Al_2O_3$) is too high, the strain point decreases. On the other hand, if $B_2O_3$/($SiO_2$+$Al_2O_3$) is too low, there are tendencies that meltability and devitrification resistance deteriorate. $B_2O_3$/($SiO_2$+$Al_2O_3$) is in the range of preferably 0 to 0.050, more preferably 0 to 0.045, still more preferably 0.001 to 0.040 and even more preferably 0.005 to 0.035.

If the value of the mass ratio $SiO_2$/$Al_2O_3$ is too high, the etching rate may decrease and if the mass ratio is too low, devitrification resistance may decrease. From such standpoints, the mass ratio $SiO_2$/$Al_2O_3$ is in the range of preferably 1.5 to 4.5, more preferably 2.0 to 4.0 and still more preferably 2.5 to 3.7. Between glasses having compositions in which values of $SiO_2$+$Al_2O_3$ are similar, the etching rate more significantly depends on $SiO_2$/$Al_2O_3$. From the standpoint of achieving all high strain point, devitrification resistance and etching rate, it is preferable that $SiO_2$+$Al_2O_3$ is in the range of 70% to 90% and $SiO_2$/$Al_2O_3$ is 1.5 to 4.5, and more preferably $SiO_2$+$Al_2O_3$ is 73% to 88% and $SiO_2$/$Al_2O_3$ is 2.0 to 4.0.

$B_2O_3$ and RO are components both of which improve meltability. Although $B_2O_3$ has an effect of improving devitrification resistance, an excess amount thereof decreases the strain point. Meanwhile, although RO has an effect of reducing the specific resistance of glass, an excess amount thereof decreases devitrification resistance. From standpoints of simultaneously achieving meltability and devitrification resistance, the mass ratio $B_2O_3$/RO is in the range of preferably 0 to 0.5, more preferably 0 to 0.4, still more preferably 0.01 to 0.3 and even more preferably 0.02 to 0.2.

If the value of the mass ratio BaO/RO is too low or too high, the devitrification temperature increases. If the value of BaO/RO is high, the Young's modulus decreases, the density increases and the specific resistance also increases. Therefore, the mass ratio BaO/RO is in the range of preferably 0 to 0.9, preferably 0.1 to 0.85 and more preferably 0.2 to 0.8.

If the value of the mass ratio ($3 \times$BaO)/(MgO+CaO+SrO) is too low or too high, the devitrification temperature increases. On the other hand, if the value of ($3 \times$BaO)/(MgO+CaO+SrO) is high, the Young's modulus decreases, the density increases and the specific resistance also increases. Therefore, the mass ratio ($3 \times$BaO)/(MgO+CaO+SrO) is in the range of preferably 5.0 or less, preferably 0.5 to 5 and more preferably 1 to 5.

In order to efficiently decrease the devitrification temperature without excessively increasing the density, the mass ratio CaO/RO is in the range of preferably 0 to 0.8, more preferably 0.1 to 0.7, still more preferably 0.15 to 0.6 and even more preferably 0.2 to 0.5.

If the value of the mass ratio (MgO/(RO+ZnO)) is low, there are tendencies that the devitrification temperature decreases and the Young's modulus decreases. Further, the density increases and the specific resistance also increases. On the other hand, if the value is high, the devitrification temperature increases and the Young's modulus decreases. Therefore, the mass ratio (MgO/(RO+ZnO)) is in the range of preferably 0.01 to 0.8 and preferably 0.02 to 0.6 or 0.03 to 0.4.

If the value of the mass ratio SrO/CaO is low, there are tendencies that the devitrification temperature decreases and the Young's modulus decreases. Further, the density increases and the specific resistance also increases. On the other hand, if the value is high, the devitrification temperature increases and the Young's modulus decreases. Therefore, the mass ratio (MgO/(CaO+SrO)) is 0.6 or less, preferably 0.36 or more and preferably 0.4 or more.

The mass ratio ($SiO_2$+$Al_2O_3$)/($B_2O_3$+RO+($10 \times R_2O$)) serves as indexes of mainly the strain point and meltability. If the value is too low, the strain point decreases. Therefore, the mass ratio ($SiO_2$+$Al_2O_3$)/($B_2O_3$+RO+($10 \times R_2O$)) is in the range of 1.0 or more and preferably 2.0 or more. On the other hand, if the value is too high, meltability and devitrification resistance decrease. Therefore, the mass ratio ($SiO_2$+$Al_2O_3$)/($B_2O_3$+RO+($10 \times R_2O$)) is in the range of preferably 1.0 to 10 and more preferably 2.0 to 7. ($SiO_2$+$Al_2O_3$)/($B_2O_3$+RO+($10 \times R_2O$)) is preferably 2.5 to 5.

$RE_2O_3$ refers to the sum of rare-earth metal oxides. Examples of the rare-earth metal oxide include $Sc_2O_3$, $Y_2O_3$, $La_2O_3$, $Pr_2O_3$, $Nd_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$ and $Lu_2O_3$. $RE_2O_3$ is a component that increases the density and the coefficient of thermal expansion. The component is also expensive. Therefore, $RE_2O_3$ is in the range of 0% or more and less than 1.0% (0% inclusive) and more preferably 0% to 0.5% (0% inclusive) and it is particularly preferable that $RE_2O_3$ is not substantially included.

From the standpoints of preventing an increase in the density and coefficient of thermal expansion and reducing the cost, it is preferable that $Y_2O_3$ and $La_2O$ are not substantially included.

In the second embodiment of the present invention, the glass substrate has a devitrification temperature of 1260° C. or lower, preferably 1250° C. or lower, more preferably 1240° C. or lower, still more preferably 1230° C. or lower and even more preferably 1220° C. or lower. Meanwhile, in the first embodiment of the present invention, the glass substrate has a devitrification temperature of 1235° C. or lower, preferably 1230° C. or lower, more preferably 1225° C. or lower, still more preferably 1220° C. or lower and even more preferably 1210° C. or lower. If the devitrification temperature is low, glass plates can be formed with ease by overflow down-draw processing. By employing overflow down-draw processing, a polishing process of the surface of the glass substrate may be omitted, and thus the glass substrate may have an improved surface quality. Also, the production cost may be reduced. If the devitrification temperature is too high, devitrification is prone to occur, and thus there is a tendency that it may be difficult to employ overflow down-draw processing.

The glass substrate of the present embodiments has an average coefficient of thermal expansion (100° C. to 300° C.) at 100° C. to 300° C. in the range of $50.0 \times 10^{-7}$ °C.$^{-1}$ or less, preferably 28.0 to $50.0 \times 10^{-7}$ °C.$^{-1}$, more preferably 33.0 to $47.0 \times 10^{-7}$ °C.$^{-1}$, still more preferably 33.0 to $46.0 \times 10^{-7}$ °C.$^{-1}$, even more preferably 35.0 to $44.0 \times 10^{-7}$ °C.$^{-1}$ and yet more preferably 38.0 to $43.0 \times 10^{-7}$ °C.$^{-1}$. If the coefficient of thermal expansion is high, thermal impact and the heat shrinkage rate tend to increase in the heat treatment step. If the coefficient of thermal expansion is high, it is difficult to reduce the heat shrinkage rate. If the coefficient of thermal expansion is high or low, the coefficient of thermal expansion may be less compatible with that of other peripheral materials such as metals and thin films formed on the glass substrate, and the peripheral parts may peel off.

Generally, if a glass substrate has low strain point, heat shrinkage is prone to occur in the heat treatment step during production of displays. The glass substrate of the present embodiments has a strain point of 720° C. or higher, preferably 725° C. or higher, more preferably 730° C. or higher, still more preferably 735° C. or higher.

The glass substrate of the present embodiments has a heat shrinkage rate of preferably 15 ppm or less. If the heat shrinkage rate is too high, the pixel pitch becomes significantly uneven, and it becomes impossible to achieve a high-definition display. In order to control the heat shrinkage rate to a predetermined range, it is preferable to configure the glass substrate to have a strain point of 720° C. or higher or 730° C. or higher. In order to control the heat shrinkage rate to be 0 ppm, it would be required to significantly extend the annealing step or perform a heat shrinkage reduction process (offline annealing) after annealing and cutting steps. In this case, the productivity is reduced and the costs are increased. In view of productivity and costs, the heat shrinkage rate is, for example, 0.1 ppm to 15 ppm or preferably 0.5 ppm to 15 ppm, more preferably 1 ppm to 15 ppm, still more preferably 1 ppm to 13 ppm and even more preferably 2 ppm to 10 ppm.

The heat shrinkage rate is expressed by the following equation after performing a heat treatment in which the glass substrate is kept at a temperature of 500° C. for 30 minutes and cooled to room temperature.

Heat shrinkage rate (ppm)={Amount of shrinkage of glass before and after heat treatment/Length of glass before heat treatment}×10$^6$ In the equation, "Amount of shrinkage of glass before and after heat treatment" means "Length of glass before heat treatment−Length of glass after heat treatment".

The glass substrate of the present embodiments has a density of, from standpoints of reducing the weight of the glass substrate and reducing the weight of a display, preferably 3.0 g/cm$^3$ or less, more preferably 2.8 g/cm$^3$ or less and still more preferably 2.65 g/cm$^3$ or less. If the density is too high, it is difficult to reduce the weight of the glass substrate, and thus it is also difficult to reduce the weight of a display.

If the glass transition point (hereinafter referred to as Tg) is low, heat shrinkage is prone to occur in the heat treatment step during production of displays. The glass substrate of the present embodiments has Tg of preferably 770° C. or higher, more preferably 775° C. or higher and still more preferably 780° C. or higher. In order to control Tg of the glass substrate to the above range, it is appropriate to increase the amounts of components such as $SiO_2$ and $Al_2O_3$ or decrease the amounts of components such as $B_2O_3$, RO and $R_2O$ within the ranges of the composition of the glass substrate of the present embodiments.

The glass of the present embodiments has a temperature at which the viscosity is $10^{2.5}$ [dPa·s] (hereinafter referred to as "melting temperature") of preferably 1680° C. or lower, more preferably in the range of 1500° C. to 1680° C., still more preferably 1520° C. to 1660° C. and even more preferably 1540° C. to 1640° C. Glass having a low melting temperature is prone to have a low strain point. In order to increase the strain point, it is required to also increase the melting temperature to some extent. However, a high melting temperature may put a burden on a melting tank. In addition, higher energy is used, resulting in an increase in costs. When glass is melted by electric melting, electric current flows through heat resistant bricks forming a melting tank rather than through glass, thus the melting tank may be damaged. In order to control the melting temperature of glass to the above range, it is appropriate to decrease the viscosity, for example, by including components such as $B_2O_3$ and RO in the ranges described above within the ranges of the composition of the glass substrate of the present embodiments.

The molten glass during production of the glass substrate of the present embodiments has a specific resistance (at 1550° C.) in the range of preferably 30 to 700 Ω·cm, more preferably 30 to 400 Ω·cm, still more preferably 30 to 300 Ω·cm and even more preferably 50 to 300 Ω·cm. If the specific resistance is too low, excessive electric current is required for melting, which may give rise to constraints in terms of facility. In addition, electrodes may be increasingly worn. If the molten glass has a specific resistance which is too high, electric current flows through heat resistant bricks forming a melting tank rather than through glass, thus the melting tank may get erosion/wear. The specific resistance of the molten glass may be controlled to be within the above range by controlling the contents of mainly RO, $R_2O$ and $Fe_2O_3$.

The glass that forms the glass substrate of the present embodiments preferably has an etching rate of 50 μm/h or more. If the etching rate is high, productivity is improved. Particularly, when etching of the glass substrate is performed after bonding the glass substrates of TFT and of color filter in order to reduce the weight, the etching rate influences the productivity. However, if the etching rate is too high, devitrification resistance of glass may decrease despite an increase in the productivity during production of displays. The heat shrinkage rate is also prone to increase. The etching rate is preferably 60 to 140 μm/h, more preferably 70 to 120 μm/h, still more preferably higher than 75 μm/h and 120 μm/h or less and even more preferably 77 to 120 μm/h. In order to increase the etching rate of glass, the value of $SiO_2+MgO+CaO-(Al_2O_3+SrO+BaO)$, $SiO_2-(¼ \times Al_2O_3)$ or $SiO_2/Al_2O_3$ may be decreased. In the present embodiments, the etching rate is defined to be one determined under the following conditions. The etching rate (μm/h) as used herein is an amount (μm) of thickness reduction in one surface of a glass substrate per unit time (1 hour) when the glass substrate is immersed in an etching solution adjusted to have an HF concentration of 1 mol/kg and an HCl concentration of 5 mol/kg at 40° C. for 1 hour.

The glass substrate of the present embodiments may have a thickness in the range of, for example, 0.1 to 1.1 mm or 0.3 to 1.1 mm. However, the thickness is not limited to this range. The thickness may be, for example, in the range of 0.3 to 0.7 mm or 0.3 to 0.5 mm. If the glass plate is too thin, the strength of the glass substrate per se decreases. For example, breakage is prone to occur during production of flat panel displays. If the thickness is too high, it is not preferable for displays that call for thickness reduction. In addition, the weight of the glass substrate is increased, making it difficult to reduce the weight of flat panel displays. Further, when etching of the glass substrate is performed after formation of TFTs, an increased amount of etching is required, consuming costs and time.

The glass substrate of the present embodiments is used for production of a flat panel display in which, for example, etching of the surface of the glass substrate is performed after array/color filter bonding. The glass substrate of the present embodiments is suitable as a glass substrate for a display (excluding CRT (Braun tube) displays). Particularly, the glass substrate of the present embodiments is suitable as a glass substrate for a flat panel display containing a LTPS-TFT or OS-TFT formed thereon. Specifically, the glass substrate is suitable as a glass substrate for a liquid crystal display and a glass substrate for an organic EL display. Particularly, the glass substrate is suitable as a glass substrate for a LTPS-TFT liquid crystal display and a glass substrate for a LTPS-TFT organic EL display. Among others, the glass substrate is suitable as a glass substrate for a display for, for instance, mobile devices for which a higher degree of definition is demanded.

<Flat Panel Display>

The present embodiments encompass a flat panel display including a glass substrate and a LTPS-TFT or OS-TFT formed on the substrate, wherein the flat panel display includes the glass substrate of the present embodiments. The flat panel display of the present embodiments may be, for example, a liquid crystal display or an organic EL display.

<Method for Producing a Glass Substrate>

The method for producing the glass substrate for a display of the present embodiments includes a melting step of melting glass raw materials blended according to a predetermined composition by employing, for example, at least direct electrical heating, a forming step of forming a molten glass melted in the melting step into a flat-plate glass, and an annealing step of annealing the flat-plate glass.

Particularly, the annealing step is preferably a step in which cooling conditions of the flat-plate glass is controlled so as to reduce a heat shrinkage rate of the flat-plate glass.

[Melting Step]

In the melting step, glass raw materials blended according to a predetermined composition are melted by, for example, direct electrical heating and/or combustion heating. The glass raw materials may be appropriately selected among well-known materials. From the standpoint of energy efficiency, it is preferable that in the melting step, the glass raw materials are melted by at least direct electrical heating. A melting tank in which the melting step is performed is preferably formed with a high-zirconia-content refractory material. The predetermined composition described above may be appropriately adjusted, for example, within the ranges of the contents described above for the components of glass.

[Forming Step]

In the forming step, the molten glass melted in the melting step is formed into a flat-plate glass. The method for forming into a flat-plate glass is suitably, for example, down-draw processing, particularly overflow down-draw processing, and the flat-plate glass formed is a glass ribbon. Other methods, such as float processing, re-draw processing, and roll-out processing, can also be employed. By employing down-draw processing, the principal surfaces of the obtained glass substrate are free surfaces which have contacted to only the atmosphere and thus become extremely smooth compared to the substrates obtained by other forming methods such as float processing, and thus the step of polishing the glass substrate surfaces after forming becomes unnecessary. As a result, production costs may be reduced, and productivity may be improved. Furthermore, the principal surfaces of the glass substrate formed by employing down-draw processing have a uniform composition, and thus, etching may be performed uniformly during etching regardless of the top side or reverse side formed during forming.

[Annealing Step]

By appropriately adjusting the conditions employed at the time of annealing, the heat shrinkage rate of the glass substrate may be controlled. Particularly, it is preferable to control cooling conditions of the flat-plate glass so as to reduce the heat shrinkage rate of the flat-plate glass. The heat shrinkage rate of the glass substrate is, as described above, 15 ppm or less, preferably 13 ppm or less and more preferably 1 to 13 ppm. In order to produce the glass substrate having such heat shrinkage rate by, for example, down-draw processing, it is preferable to perform annealing so that the cooling rate of the glass ribbon as the flat-plate glass is 30° C./minute to 300° C./minute in the temperature range from Tg to (Tg−100° C.). If the cooling rate is too high, the heat shrinkage rate may not be sufficiently reduced. On the other hand, if the cooling rate is too low, productivity is decreased and the device for production of glass (annealing furnace) may become huge. The cooling rate is preferably in the range of 30° C./minute to 300° C./minute, more preferably 50° C./minute to 200° C./minute and still more preferably 60° C./minute to 120° C./minute. If the cooling rate is 30° C./minute to 300° C./minute, production of the glass substrate of the present embodiments may be ensured. The heat shrinkage rate may be decreased by performing offline annealing after cutting the flat-plate glass in the downstream of the annealing step. However, in this case, facilities for performing offline annealing is required in addition to the facilities for performing the annealing step. Therefore, as described above, it is preferable to control the heat shrinkage rate so as to reduce the same in the annealing step and omit the offline annealing from the standpoints of productivity and costs. In the present specification, the cooling rate of a glass ribbon represents the cooling rate of the central part of a glass ribbon in the width direction.

[Examples]

Hereinbelow, the present embodiments are more specifically described based on Examples which do not limit the present embodiments. The following physical properties were measured in the following Examples and Comparative Examples.

(Strain Point)

Measurement was carried out on a beam bending measurement device (produced by Tokyo Kogyo Co., Ltd.) and the strain point was determined by calculation according to the beam bending method (ASTM C-598).

(Devitrification Temperature)

Glass was pulverized, passed through a 2380-μm sieve and glass particles retained on a 1000-μm sieve were placed in a platinum boat. The platinum boat was kept in an electric furnace having a temperature gradient of 1050° C. to 1380° C. for 5 hours before removing from the furnace, and devitrification that occurred inside of the glass was observed on an optical microscope at 50-fold magnification. The devitrification temperature was obtained as a maximum temperature at which devitrification was observed.

(Method for Measuring Average Coefficient α of Thermal Expansion and Tg in the Range of 100° C. to 300° C.)

The measurement was performed on a differential dilatometer (Thermo Plus2 TMA8310). The heating rate during the measurement was 5° C./minute. Based on the measurement results, the average coefficient of thermal expansion and Tg in the temperature range of 100° C. to 300° C. was determined.

(Heat Shrinkage Rate)

The heat shrinkage rate was determined according to the scribe line method on glass with the size of 90 to 200 mm×15 to 30 mm×0.3 to 1 mm. In the heat treatment for measurement of the heat shrinkage, glass was kept at a temperature of 500° C. for 30 minutes in a furnace with air circulation (produced by Nabertherm GmbH, N120/85HA) and cooled to room temperature.

Heat shrinkage rate (ppm)={Amount of shrinkage of glass due to heat treatment/Distance between scribe lines on glass before heat treatment}×10$^6$ When the heat shrinkage of glass was measured which was obtained by melting glass raw materials in a platinum crucible and draining the same onto an iron plate for cooling and solidification, the glass was cut, ground and polished so as to have a thickness of 0.5 mm, kept at a temperature of Tg+15° C. for 30 minutes in an electric furnace and removed from the furnace at a cooling rate of 150° C./minute to 250° C./minute and then used for measurement.

(Density)

The density of the glass was measured according to the Archimedean method.

(Etching Rate)

The etching rate (μm/h) was calculated by measuring the amount (μm) of thickness reduction after immersing glass (12.5 mm×20 mm×0.7 mm) in an etching solution (200 mL) adjusted to have an HF concentration of 1 mol/kg and an HCl concentration of 5 mol/kg at 40° C. for 1 hour and calculating the amount (μm) of thickness reduction in one surface of the glass substrate per unit time (1 hour).

The compositions and evaluations in Examples are hereinafter described.

Glasses of Examples 1 to 63 were prepared according to the following procedures so as to have the glass compositions indicated in Table 1. The obtained glasses were analyzed for the strain point, the devitrification temperature, Tg, the average coefficient (α) of thermal expansion in the range from 100° C. to 300° C., the heat shrinkage rate, the density and the etching rate.

Table 1-1

| wt % | Example 1 | Example 2 | Example 3 | Example 4 | Example 5 | Example 6 |
|---|---|---|---|---|---|---|
| SiO2 | 59.5 | 61.1 | 60.9 | 60.0 | 63.3 | 61.0 |
| Al2O3 | 19.9 | 18.5 | 20.0 | 18.5 | 17.9 | 19.3 |
| B2O3 | 3.0 | 1.5 | 1.5 | 1.5 | 1.5 | 1.5 |
| Na2O | 0.0 | 0.0 | 0.0 | 0.0 | 0.0 | 0.0 |
| K2O | 0.2 | 0.2 | 0.2 | 0.2 | 0.2 | 0.2 |
| MgO | 2.6 | 2.7 | 2.6 | 2.9 | 2.5 | 2.7 |
| CaO | 4.8 | 5.1 | 4.8 | 5.4 | 4.7 | 4.9 |
| SrO | 0.0 | 0.0 | 0.0 | 0.0 | 0.0 | 0.0 |
| BaO | 9.8 | 10.5 | 9.8 | 11.1 | 9.6 | 10.1 |
| ZnO | 0.0 | 0.0 | 0.0 | 0.0 | 0.0 | 0.0 |
| ZrO2 | 0.0 | 0.0 | 0.0 | 0.0 | 0.0 | 0.0 |
| Sb2O3 | 0.0 | 0.0 | 0.0 | 0.0 | 0.0 | 0.0 |
| SnO2 | 0.2 | 0.2 | 0.2 | 0.2 | 0.2 | 0.2 |
| Fe2O3 | 0.046 | 0.046 | 0.046 | 0.046 | 0.047 | 0.046 |
| Total | 100.0 | 100.0 | 100.0 | 100.0 | 100.0 | 100.0 |
| LiO2 + Na2O + K2O | 0.2 | 0.2 | 0.2 | 0.2 | 0.2 | 0.2 |
| SiO2 − ¼Al2O3 | 54.5 | 56.5 | 55.9 | 55.4 | 58.8 | 56.2 |
| RO(MgO + CaO + SrO + BaO) | 17.1 | 18.3 | 17.1 | 19.5 | 16.7 | 17.7 |
| (SiO2 + Al2O3)/(B2O3 + RO) | 3.9 | 4.0 | 4.3 | 3.7 | 4.5 | 4.2 |
| B2O3 + RO + ZnO | 20.1 | 19.9 | 18.6 | 21.0 | 18.3 | 19.3 |
| SiO2 + Al2O3 | 79.4 | 79.6 | 80.9 | 78.5 | 81.2 | 80.2 |
| B2O3/(SiO2 + Al2O3) | 0.04 | 0.02 | 0.02 | 0.02 | 0.02 | 0.02 |
| SiO2/Al2O3 | 2.98 | 3.29 | 3.05 | 3.25 | 3.53 | 3.17 |
| B2O3/RO | 0.18 | 0.08 | 0.09 | 0.08 | 0.09 | 0.09 |
| BaO/RO | 0.57 | 0.57 | 0.57 | 0.57 | 0.57 | 0.57 |
| 3 × BaO/MgO + CaO + SrO | 4.0 | 4.0 | 4.0 | 4.0 | 4.0 | 4.0 |
| CaO/RO | 0.28 | 0.28 | 0.28 | 0.28 | 0.28 | 0.28 |
| MgO/(RO + ZnO) | 0.15 | 0.15 | 0.15 | 0.15 | 0.15 | 0.15 |
| SrO/CaO | 0.00 | 0.00 | 0.00 | 0.00 | 0.00 | 0.00 |
| (SiO2 + Al2O3)/(B2O3 + RO + 10 × R2O) | 3.54 | 3.59 | 3.86 | 3.37 | 3.95 | 3.72 |
| SiO2 − Al2O3 + MgO + CaO − SrO − BaO | 37.1 | 39.9 | 38.5 | 38.8 | 43.0 | 39.2 |
| Devitrification Temperature | 1186 | 1218 | 1229 | 1205 | 1195 | 1226 |
| Tg(° C.) | 774 | 772 | 789 | 770 | 785 | 785 |

-continued

| | | | | | | |
|---|---|---|---|---|---|---|
| Strain Point(° C.) | 723 | 722 | 739 | 720 | 733 | 734 |
| α (×10−7) (100-300° C.) | 40 | 42 | 40 | 43 | 40 | 40 |
| Density (g/cm^3) | 2.60 | 2.63 | 2.61 | 2.64 | 2.59 | 2.61 |
| Heat Shrinkage Rate | 8 | 8 | 6 | 9 | 7 | 7 |
| Etching Rate (μm/h) | 80 | 75 | 77 | 78 | 69 | 76 |

Table 1-2

| wt % | Example 7 | Example 8 | Example 9 | Example 10 | Example 11 | Example 12 |
|---|---|---|---|---|---|---|
| SiO2 | 58.8 | 59.9 | 59.9 | 59.3 | 58.7 | 58.1 |
| Al2O3 | 19.8 | 19.9 | 19.2 | 19.9 | 20.6 | 21.2 |
| B2O3 | 1.5 | 1.5 | 1.5 | 1.5 | 1.5 | 1.5 |
| Na2O | 0.0 | 0.0 | 0.0 | 0.0 | 0.0 | 0.0 |
| K2O | 0.2 | 0.2 | 0.2 | 0.2 | 0.2 | 0.2 |
| MgO | 2.9 | 2.7 | 2.8 | 2.8 | 2.8 | 2.8 |
| CaO | 5.4 | 5.1 | 5.3 | 5.2 | 5.2 | 5.2 |
| SrO | 0.0 | 0.0 | 0.0 | 0.0 | 0.0 | 0.0 |
| BaO | 11.1 | 10.4 | 10.8 | 10.7 | 10.7 | 10.7 |
| ZnO | 0.0 | 0.0 | 0.0 | 0.0 | 0.0 | 0.0 |
| ZrO2 | 0.0 | 0.0 | 0.0 | 0.0 | 0.0 | 0.0 |
| Sb2O3 | 0.0 | 0.0 | 0.0 | 0.0 | 0.0 | 0.0 |
| SnO2 | 0.2 | 0.2 | 0.2 | 0.2 | 0.2 | 0.2 |
| Fe2O3 | 0.046 | 0.046 | 0.046 | 0.046 | 0.046 | 0.046 |
| Total | 100.0 | 100.0 | 100.0 | 100.0 | 100.0 | 100.0 |
| LiO2 + Na2O + K2O | 0.2 | 0.2 | 0.2 | 0.2 | 0.2 | 0.2 |
| SiO2 − ¼Al2O3 | 53.8 | 54.9 | 55.1 | 54.4 | 53.6 | 52.8 |
| RO(MgO + CaO + SrO + BaO) | 19.3 | 18.2 | 18.8 | 18.8 | 18.7 | 18.7 |
| (SiO2 + Al2O3)/(B2O3 + RO) | 3.8 | 4.0 | 3.9 | 3.9 | 3.9 | 3.9 |
| B2O3 + RO + ZnO | 20.8 | 19.7 | 20.4 | 20.3 | 20.2 | 20.2 |
| SiO2 + Al2O3 | 78.7 | 79.8 | 79.1 | 79.2 | 79.3 | 79.3 |
| B2O3/(SiO2 + Al2O3) | 0.02 | 0.02 | 0.02 | 0.02 | 0.02 | 0.02 |
| SiO2/Al2O3 | 2.96 | 3.01 | 3.12 | 2.98 | 2.86 | 2.74 |
| B2O3/RO | 0.08 | 0.08 | 0.08 | 0.08 | 0.08 | 0.08 |
| BaO/RO | 0.57 | 0.57 | 0.57 | 0.57 | 0.57 | 0.57 |
| 3 × BaO/MgO + CaO + SrO | 4.0 | 4.0 | 4.0 | 4.0 | 4.0 | 4.0 |
| CaO/RO | 0.28 | 0.28 | 0.28 | 0.28 | 0.28 | 0.28 |
| MgO/(RO + ZnO) | 0.15 | 0.15 | 0.15 | 0.15 | 0.15 | 0.15 |
| SrO/CaO | 0.00 | 0.00 | 0.00 | 0.00 | 0.00 | 0.00 |
| (SiO2 + Al2O3)/(B2O3 + RO + 10 × R2O) | 3.40 | 3.62 | 3.49 | 3.50 | 3.52 | 3.53 |
| SiO2 − Al2O3 + MgO + CaO − SrO − BaO | 36.2 | 37.3 | 38.0 | 36.8 | 35.5 | 34.2 |
| Devitrification Temperature | 1241 | 1242 | 1223 | 1247 | 1258 | 1252 |
| Tg(° C.) | 777 | 783 | 777 | 782 | 788 | 788 |
| Strain Point(° C.) | 726 | 733 | 728 | 730 | 737 | 738 |
| α (×10−7) (100-300° C.) | 42 | 41 | 43 | 42 | 43 | 41 |
| Density (g/cm^3) | 2.65 | 2.63 | 2.64 | 2.64 | 2.65 | 2.65 |
| Heat Shrinkage Rate | 8 | 7 | 8 | 7 | 7 | 6 |
| Etching Rate (μm/h) | 84 | 80 | 79 | 82 | 84 | 87 |

Table 1-3

| wt % | Example 13 | Example 14 | Example 15 | Example 16 | Example 17 | Example 18 |
|---|---|---|---|---|---|---|
| SiO2 | 57.7 | 58.3 | 62.1 | 62.3 | 63.2 | 64.5 |
| Al2O3 | 20.5 | 19.8 | 18.6 | 17.2 | 18.7 | 17.3 |
| B2O3 | 1.5 | 1.5 | 1.5 | 1.5 | 1.5 | 1.5 |
| Na2O | 0.0 | 0.0 | 0.0 | 0.0 | 0.0 | 0.0 |
| K2O | 0.2 | 0.2 | 0.2 | 0.2 | 0.2 | 0.2 |
| MgO | 3.0 | 3.0 | 2.6 | 2.8 | 2.4 | 2.4 |
| CaO | 5.5 | 5.5 | 4.8 | 5.1 | 4.5 | 4.5 |
| SrO | 0.0 | 0.0 | 0.0 | 0.0 | 0.0 | 0.0 |
| BaO | 11.3 | 11.4 | 9.8 | 10.6 | 9.2 | 9.3 |
| ZnO | 0.0 | 0.0 | 0.0 | 0.0 | 0.0 | 0.0 |
| ZrO2 | 0.0 | 0.0 | 0.0 | 0.0 | 0.0 | 0.0 |
| Sb2O3 | 0.0 | 0.0 | 0.0 | 0.0 | 0.0 | 0.0 |
| SnO2 | 0.2 | 0.2 | 0.2 | 0.2 | 0.2 | 0.2 |
| Fe2O3 | 0.046 | 0.046 | 0.047 | 0.047 | 0.047 | 0.047 |
| Total | 100.0 | 100.0 | 100.0 | 100.0 | 100.0 | 100.0 |
| LiO2 + Na2O + K2O | 0.2 | 0.2 | 0.2 | 0.2 | 0.2 | 0.2 |
| SiO2 − ¼Al2O3 | 52.6 | 53.3 | 57.5 | 58.1 | 58.5 | 60.2 |
| RO(MgO + CaO + SrO + BaO) | 19.8 | 19.9 | 17.2 | 18.5 | 16.1 | 16.2 |
| (SiO2 + Al2O3)/(B2O3 + RO) | 3.7 | 3.7 | 4.3 | 4.0 | 4.6 | 4.6 |
| B2O3 + RO + ZnO | 21.3 | 21.4 | 18.8 | 20.0 | 17.6 | 17.7 |

-continued

| | | | | | | |
|---|---|---|---|---|---|---|
| SiO2 + Al2O3 | 78.2 | 78.1 | 80.7 | 79.5 | 81.9 | 81.8 |
| B2O3/(SiO2 + Al2O3) | 0.02 | 0.02 | 0.02 | 0.02 | 0.02 | 0.02 |
| SiO2/Al2O3 | 2.82 | 2.94 | 3.34 | 3.63 | 3.39 | 3.73 |
| B2O3/RO | 0.08 | 0.08 | 0.09 | 0.08 | 0.09 | 0.09 |
| BaO/RO | 0.57 | 0.57 | 0.57 | 0.57 | 0.57 | 0.57 |
| 3 × BaO/MgO + CaO + SrO | 4.0 | 4.0 | 4.0 | 4.0 | 4.0 | 4.0 |
| CaO/RO | 0.28 | 0.28 | 0.28 | 0.28 | 0.28 | 0.28 |
| MgO/(RO + ZnO) | 0.15 | 0.15 | 0.15 | 0.15 | 0.15 | 0.15 |
| SrO/CaO | 0.00 | 0.00 | 0.00 | 0.00 | 0.00 | 0.00 |
| (SiO2 + Al2O3)/(B2O3 + RO + 10 × R2O) | 3.31 | 3.30 | 3.83 | 3.56 | 4.10 | 4.07 |
| SiO2 − Al2O3 + MgO + CaO − SrO − BaO | 34.4 | 35.6 | 41.1 | 42.5 | 42.2 | 44.9 |
| Devitrification Temperature | 1246 | 1252 | 1222 | 1185 | 1193 | 1218 |
| Tg(° C.) | 778 | 777 | 783 | 773 | 788 | 782 |
| Strain Point(° C.) | 726 | 725 | 731 | 721 | 739 | 732 |
| α (×10−7) (100-300° C.) | 44 | 43 | 41 | 42 | 38 | 39 |
| Density (g/cm^3) | 2.67 | 2.65 | 2.60 | 2.61 | 2.58 | 2.57 |
| Heat Shrinkage Rate | 7 | 8 | 7 | 8 | 6 | 7 |
| Etching Rate (μm/h) | 88 | 85 | 71 | 69 | 68 | 62 |

Table 1-4

| wt % | Example 19 | Example 20 | Example 21 | Example 22 | Example 23 | Example 24 |
|---|---|---|---|---|---|---|
| SiO2 | 56.7 | 59.8 | 59.6 | 61.0 | 60.8 | 60.0 |
| Al2O3 | 20.4 | 20.6 | 20.0 | 18.5 | 19.9 | 18.5 |
| B2O3 | 1.5 | 1.5 | 2.8 | 0.5 | 0.5 | 0.5 |
| Na2O | 0.0 | 0.0 | 0.0 | 0.0 | 0.0 | 0.0 |
| K2O | 0.2 | 0.2 | 0.2 | 0.2 | 0.2 | 0.2 |
| MgO | 3.1 | 2.6 | 3.0 | 2.9 | 2.7 | 3.1 |
| CaO | 5.8 | 4.9 | 3.9 | 5.4 | 5.1 | 5.8 |
| SrO | 0.0 | 0.0 | 1.7 | 0.0 | 0.0 | 0.0 |
| BaO | 12.0 | 10.1 | 8.6 | 11.2 | 10.5 | 11.8 |
| ZnO | 0.0 | 0.0 | 0.0 | 0.0 | 0.0 | 0.0 |
| ZrO2 | 0.0 | 0.0 | 0.0 | 0.0 | 0.0 | 0.0 |
| Sb2O3 | 0.0 | 0.0 | 0.0 | 0.0 | 0.0 | 0.0 |
| SnO2 | 0.2 | 0.2 | 0.2 | 0.2 | 0.2 | 0.2 |
| Fe2O3 | 0.046 | 0.046 | 0.000 | 0.000 | 0.000 | 0.000 |
| Total | 100.0 | 100.0 | 100.0 | 100.0 | 100.0 | 100.0 |
| LiO2 + Na2O + K2O | 0.2 | 0.2 | 0.2 | 0.2 | 0.2 | 0.2 |
| SiO2 − ¼Al2O3 | 51.6 | 54.6 | 54.6 | 56.4 | 55.8 | 55.3 |
| RO(MgO + CaO + SrO + BaO) | 20.9 | 17.6 | 17.1 | 19.5 | 18.3 | 20.6 |
| (SiO2 + Al2O3)/(B2O3 + RO) | 3.4 | 4.2 | 4.0 | 4.0 | 4.3 | 3.7 |
| B2O3 + RO + ZnO | 22.4 | 19.1 | 20.0 | 20.0 | 18.8 | 21.1 |
| SiO2 + Al2O3 | 77.1 | 80.4 | 79.6 | 79.5 | 80.8 | 78.4 |
| B2O3/(SiO2 + Al2O3) | 0.02 | 0.02 | 0.04 | 0.01 | 0.01 | 0.01 |
| SiO2/Al2O3 | 2.77 | 2.90 | 2.98 | 3.29 | 3.05 | 3.25 |
| B2O3/RO | 0.07 | 0.09 | 0.16 | 0.03 | 0.03 | 0.02 |
| BaO/RO | 0.57 | 0.57 | 0.50 | 0.57 | 0.57 | 0.57 |
| 3 × BaO/MgO + CaO + SrO | 4.0 | 4.0 | 3.0 | 4.00 | 4.00 | 4.00 |
| CaO/RO | 0.28 | 0.28 | 0.23 | 0.28 | 0.28 | 0.28 |
| MgO/(RO + ZnO) | 0.15 | 0.15 | 0.17 | 0.15 | 0.15 | 0.15 |
| SrO/CaO | 0.00 | 0.00 | 0.42 | 0.00 | 0.00 | 0.00 |
| (SiO2 + Al2O3)/(B2O3 + RO + 10 × R2O) | 3.12 | 3.75 | 3.57 | 3.56 | 3.83 | 3.35 |
| SiO2 − Al2O3 + MgO + CaO − SrO − BaO | 33.2 | 36.6 | 36.3 | 39.7 | 38.3 | 38.5 |
| Devitrification Temperature | 1257 | 1252 | 1188 | 1236 | 1254 | 1238 |
| Tg(° C.) | 775 | 794 | 773 | 788 | 797 | 775 |
| Strain Point(° C.) | 725 | 743 | 723 | 737 | 746 | 724 |
| α (×10−7) (100-300° C.) | 45 | 40 | 40 | 42 | 42 | 44 |
| Density (g/cm^3) | 2.67 | 2.63 | 2.61 | 2.64 | 2.63 | 2.66 |
| Heat Shrinkage Rate | 9 | 6 | 8 | 6 | 5 | 8 |
| Etching Rate (μm/h) | 91 | 81 | 79 | 76 | 77 | 78 |

Table 1-5

| wt % | Example 25 | Example 26 | Example 27 | Example 28 | Example 29 | Example 30 |
|---|---|---|---|---|---|---|
| SiO2 | 63.2 | 60.9 | 59.8 | 59.9 | 62.3 | 63.1 |
| Al2O3 | 17.9 | 19.2 | 19.9 | 19.2 | 17.1 | 18.6 |
| B2O3 | 0.5 | 0.5 | 0.5 | 0.5 | 0.5 | 0.5 |
| Na2O | 0.0 | 0.0 | 0.0 | 0.0 | 0.0 | 0.0 |
| K2O | 0.2 | 0.2 | 0.2 | 0.2 | 0.2 | 0.2 |
| MgO | 2.7 | 2.8 | 2.9 | 3.0 | 2.9 | 2.6 |

-continued

| | | | | | | |
|---|---|---|---|---|---|---|
| CaO | 5.0 | 5.3 | 5.4 | 5.6 | 5.5 | 4.8 |
| SrO | 0.0 | 0.0 | 0.0 | 0.0 | 0.0 | 0.0 |
| BaO | 10.2 | 10.8 | 11.1 | 11.4 | 11.2 | 9.9 |
| ZnO | 0.0 | 0.0 | 0.0 | 0.0 | 0.0 | 0.0 |
| ZrO2 | 0.0 | 0.0 | 0.0 | 0.0 | 0.0 | 0.0 |
| Sb2O3 | 0.0 | 0.0 | 0.0 | 0.0 | 0.0 | 0.0 |
| SnO2 | 0.2 | 0.2 | 0.2 | 0.2 | 0.2 | 0.2 |
| Fe2O3 | 0.000 | 0.000 | 0.000 | 0.000 | 0.000 | 0.000 |
| Total | 100.0 | 100.0 | 100.0 | 100.0 | 100.0 | 100.0 |
| LiO2 + Na2O + K2O | 0.2 | 0.2 | 0.2 | 0.2 | 0.2 | 0.2 |
| SiO2 − ¼Al2O3 | 58.7 | 56.1 | 54.8 | 55.1 | 58.0 | 58.5 |
| RO(MgO + CaO + SrO + BaO) | 17.9 | 18.9 | 19.4 | 20.0 | 19.6 | 17.3 |
| (SiO2 + Al2O3)/(B2O3 + RO) | 4.4 | 4.1 | 4.0 | 3.9 | 3.9 | 4.6 |
| B2O3 + RO + ZnO | 18.4 | 19.4 | 19.9 | 20.5 | 20.1 | 17.8 |
| SiO2 + Al2O3 | 81.1 | 80.1 | 79.7 | 79.0 | 79.4 | 81.8 |
| B2O3/(SiO2 + Al2O3) | 0.01 | 0.01 | 0.01 | 0.01 | 0.01 | 0.01 |
| SiO2/Al2O3 | 3.53 | 3.17 | 3.01 | 3.12 | 3.63 | 3.39 |
| B2O3/RO | 0.03 | 0.03 | 0.03 | 0.03 | 0.03 | 0.03 |
| BaO/RO | 0.57 | 0.57 | 0.57 | 0.57 | 0.57 | 0.57 |
| 3 × BaO/MgO + CaO + SrO | 4.0 | 4.00 | 4.00 | 4.00 | 4.0 | 4.0 |
| CaO/RO | 0.28 | 0.28 | 0.28 | 0.28 | 0.28 | 0.28 |
| MgO/(RO + ZnO) | 0.15 | 0.15 | 0.15 | 0.15 | 0.15 | 0.15 |
| SrO/CaO | 0.00 | 0.00 | 0.00 | 0.00 | 0.00 | 0.00 |
| (SiO2 + Al2O3)/(B2O3 + RO + 10 × R2O) | 3.91 | 3.69 | 3.59 | 3.46 | 3.53 | 4.06 |
| SiO2 − Al2O3 + MgO + CaO − SrO − BaO | 42.7 | 39.0 | 37.1 | 37.8 | 42.3 | 42.0 |
| Devitrification Temperature | 1195 | 1254 | 1258 | 1239 | 1200 | 1217 |
| Tg(° C.) | 795 | 790 | 793 | 786 | 776 | 798 |
| Strain Point(° C.) | 745 | 739 | 742 | 734 | 726 | 747 |
| α (×10−7) (100-300° C.) | 39 | 41 | 42 | 43 | 43 | 40 |
| Density (g/cm^3) | 2.60 | 2.64 | 2.65 | 2.66 | 2.63 | 2.60 |
| Heat Shrinkage Rate | 6 | 6 | 6 | 7 | 8 | 5 |
| Etching Rate (μm/h) | 67 | 76 | 80 | 79 | 70 | 68 |

Table 1-6

| wt % | Example 31 | Example 32 | Example 33 | Example 34 | Example 35 | Example 36 |
|---|---|---|---|---|---|---|
| SiO2 | 64.4 | 60.7 | 61.9 | 60.1 | 60.1 | 60.0 |
| Al2O3 | 17.2 | 20.6 | 20.0 | 20.1 | 20.1 | 19.8 |
| B2O3 | 0.5 | 0.5 | 0.5 | 2.0 | 2.0 | 2.0 |
| Na2O | 0.0 | 0.0 | 0.0 | 0.0 | 0.0 | 0.0 |
| K2O | 0.2 | 0.2 | 0.2 | 0.2 | 0.2 | 0.2 |
| MgO | 2.6 | 2.6 | 2.6 | 3.0 | 3.0 | 3.1 |
| CaO | 4.9 | 4.9 | 4.8 | 4.0 | 4.0 | 3.8 |
| SrO | 0.0 | 0.0 | 0.0 | 1.7 | 1.6 | 2.6 |
| BaO | 9.9 | 10.1 | 9.8 | 8.7 | 8.7 | 8.2 |
| ZnO | 0.0 | 0.0 | 0.0 | 0.0 | 0.0 | 0.0 |
| ZrO2 | 0.0 | 0.0 | 0.0 | 0.0 | 0.0 | 0.0 |
| Sb2O3 | 0.0 | 0.0 | 0.0 | 0.0 | 0.0 | 0.0 |
| SnO2 | 0.2 | 0.2 | 0.2 | 0.2 | 0.2 | 0.2 |
| Fe2O3 | 0.000 | 0.000 | 0.000 | 0.000 | 0.000 | 0.000 |
| Total | 100.0 | 100.0 | 100.0 | 100.0 | 100.0 | 100.0 |
| LiO2 + Na2O + K2O | 0.2 | 0.2 | 0.2 | 0.2 | 0.2 | 0.2 |
| SiO2 − ¼Al2O3 | 60.1 | 55.6 | 56.9 | 55.1 | 55.1 | 55.0 |
| RO(MgO + CaO + SrO + BaO) | 17.4 | 17.7 | 17.2 | 17.3 | 17.3 | 17.7 |
| (SiO2 + Al2O3)/(B2O3 + RO) | 4.6 | 4.5 | 4.6 | 4.2 | 4.2 | 4.0 |
| B2O3 + RO + ZnO | 17.9 | 18.2 | 17.7 | 19.3 | 19.3 | 19.7 |
| SiO2 + Al2O3 | 81.6 | 81.4 | 81.9 | 80.2 | 80.3 | 79.8 |
| B2O3/(SiO2 + Al2O3) | 0.01 | 0.01 | 0.01 | 0.03 | 0.03 | 0.03 |
| SiO2/Al2O3 | 3.73 | 2.94 | 3.09 | 2.98 | 2.98 | 3.02 |
| B2O3/RO | 0.03 | 0.03 | 0.03 | 0.12 | 0.12 | 0.11 |
| BaO/RO | 0.57 | 0.57 | 0.57 | 0.50 | 0.50 | 0.46 |
| 3 × BaO/MgO + CaO + SrO | 4.0 | 4.00 | 4.00 | 3.01 | 3.04 | 2.61 |
| CaO/RO | 0.28 | 0.28 | 0.28 | 0.23 | 0.23 | 0.22 |
| MgO/(RO + ZnO) | 0.15 | 0.15 | 0.15 | 0.17 | 0.17 | 0.17 |
| SrO/CaO | 0.00 | 0.00 | 0.00 | 0.42 | 0.40 | 0.67 |
| (SiO2 + Al2O3)/(B2O3 + RO + 10 × R2O) | 4.03 | 3.97 | 4.09 | 3.71 | 3.72 | 3.62 |
| SiO2 − Al2O3 + MgO + CaO − SrO − BaO | 44.7 | 37.5 | 39.4 | 36.6 | 36.7 | 36.2 |
| Devitrification Temperature | 1207 | 1252 | 1245 | 1180 | 1180 | 1187 |
| Tg(° C.) | 795 | 800 | 801 | 781 | 785 | 780 |
| Strain Point(° C.) | 746 | 750 | 749 | 730 | 734 | 728 |
| α (×10−7) (100-300° C.) | 40 | 41 | 41 | 40 | 40 | 41 |

-continued

| | | | | | | |
|---|---|---|---|---|---|---|
| Density (g/cm^3) | 2.60 | 2.63 | 2.62 | 2.62 | 2.61 | 2.62 |
| Heat Shrinkage Rate | 6 | 5 | 5 | 7 | 7 | 7 |
| Etching Rate (μm/h) | 63 | 77 | 73 | 80 | 79 | 80 |

Table 1-7

| wt % | Example 37 | Example 38 | Example 39 | Example 40 | Example 41 | Example 42 |
|---|---|---|---|---|---|---|
| SiO2 | 59.4 | 59.7 | 60.0 | 59.5 | 59.6 | 60.8 |
| Al2O3 | 20.0 | 19.7 | 19.4 | 19.8 | 19.7 | 19.7 |
| B2O3 | 2.4 | 2.4 | 2.4 | 2.8 | 2.8 | 1.6 |
| Na2O | 0.0 | 0.0 | 0.0 | 0.0 | 0.0 | 0.0 |
| K2O | 0.2 | 0.2 | 0.2 | 0.2 | 0.2 | 0.2 |
| MgO | 3.1 | 3.1 | 3.1 | 3.0 | 3.0 | 3.0 |
| CaO | 4.1 | 4.1 | 3.8 | 4.0 | 4.0 | 4.0 |
| SrO | 1.6 | 1.6 | 2.6 | 1.8 | 1.8 | 1.8 |
| BaO | 8.9 | 8.9 | 8.3 | 8.7 | 8.7 | 8.7 |
| ZnO | 0.0 | 0.0 | 0.0 | 0.0 | 0.0 | 0.0 |
| ZrO2 | 0.0 | 0.0 | 0.0 | 0.0 | 0.0 | 0.0 |
| Sb2O3 | 0.0 | 0.0 | 0.0 | 0.0 | 0.0 | 0.0 |
| SnO2 | 0.2 | 0.2 | 0.2 | 0.2 | 0.2 | 0.2 |
| Fe2O3 | 0.000 | 0.000 | 0.000 | 0.000 | 0.000 | 0.000 |
| Total | 100.0 | 100.0 | 100.0 | 100.0 | 100.0 | 100.0 |
| LiO2 + Na2O + K2O | 0.2 | 0.2 | 0.2 | 0.2 | 0.2 | 0.2 |
| SiO2 − ¼Al2O3 | 54.3 | 54.7 | 55.1 | 54.5 | 54.7 | 55.9 |
| RO(MgO + CaO + SrO + BaO) | 17.7 | 17.8 | 17.8 | 17.4 | 17.4 | 17.5 |
| (SiO2 + Al2O3)/(B2O3 + RO) | 3.9 | 3.9 | 3.9 | 3.9 | 3.9 | 4.2 |
| B2O3 + RO + ZnO | 20.2 | 20.2 | 20.2 | 20.2 | 20.2 | 19.1 |
| SiO2 + Al2O3 | 79.4 | 79.4 | 79.3 | 79.3 | 79.3 | 80.5 |
| B2O3/(SiO2 + Al2O3) | 0.03 | 0.03 | 0.03 | 0.04 | 0.04 | 0.02 |
| SiO2/Al2O3 | 2.96 | 3.03 | 3.10 | 3.00 | 3.03 | 3.09 |
| B2O3/RO | 0.14 | 0.14 | 0.14 | 0.16 | 0.16 | 0.09 |
| BaO/RO | 0.50 | 0.50 | 0.46 | 0.50 | 0.50 | 0.50 |
| 3 × BaO/MgO + CaO + SrO | 3.04 | 3.04 | 2.61 | 2.97 | 2.97 | 2.97 |
| CaO/RO | 0.23 | 0.23 | 0.22 | 0.23 | 0.23 | 0.23 |
| MgO/(RO + ZnO) | 0.17 | 0.17 | 0.17 | 0.17 | 0.17 | 0.17 |
| SrO/CaO | 0.40 | 0.40 | 0.67 | 0.46 | 0.46 | 0.45 |
| (SiO2 + Al2O3)/(B2O3 + RO + 10 × R2O) | 3.54 | 3.53 | 3.52 | 3.52 | 3.52 | 3.76 |
| SiO2 − Al2O3 + MgO + CaO − SrO − BaO | 35.9 | 36.6 | 36.7 | 36.2 | 36.4 | 37.6 |
| Devitrification Temperature | 1207 | 1182 | 1209 | 1194 | 1187 | 1205 |
| Tg(° C.) | 773 | 774 | 777 | 778 | 776 | 792 |
| Strain Point(° C.) | 722 | 724 | 727 | 726 | 725 | 740 |
| α (×10-7) (100-300° C.) | 41 | 42 | 41 | 40 | 40 | 40 |
| Density (g/cm^3) | 2.62 | 2.61 | 2.61 | 2.62 | 2.61 | 2.61 |
| Heat Shrinkage Rate | 8 | 8 | 8 | 8 | 8 | 6 |
| Etching Rate (μm/h) | 83 | 81 | 80 | 82 | 81 | 77 |

Table 1-8

| wt % | Example 43 | Example 44 | Example 45 | Example 46 | Example 47 | Example 48 |
|---|---|---|---|---|---|---|
| SiO2 | 59.9 | 60.5 | 60.3 | 59.9 | 60.4 | 60.8 |
| Al2O3 | 20.2 | 18.8 | 19.7 | 20.5 | 19.9 | 20.1 |
| B2O3 | 1.6 | 1.6 | 1.6 | 1.6 | 1.6 | 1.6 |
| Na2O | 0.0 | 0.0 | 0.0 | 0.0 | 0.0 | 0.0 |
| K2O | 0.2 | 0.2 | 0.2 | 0.2 | 0.2 | 0.2 |
| MgO | 3.1 | 3.2 | 3.1 | 3.0 | 3.1 | 3.3 |
| CaO | 4.1 | 4.2 | 4.1 | 4.0 | 3.9 | 4.0 |
| SrO | 1.8 | 1.9 | 1.9 | 1.8 | 2.1 | 1.8 |
| BaO | 8.9 | 9.3 | 9.0 | 8.8 | 8.5 | 7.8 |
| ZnO | 0.0 | 0.0 | 0.0 | 0.0 | 0.0 | 0.0 |
| ZrO2 | 0.0 | 0.0 | 0.0 | 0.0 | 0.0 | 0.0 |
| Sb2O3 | 0.0 | 0.0 | 0.0 | 0.0 | 0.0 | 0.0 |
| SnO2 | 0.2 | 0.2 | 0.2 | 0.2 | 0.2 | 0.2 |
| Fe2O3 | 0.000 | 0.000 | 0.000 | 0.000 | 0.000 | 0.000 |
| Total | 100.0 | 100.0 | 100.0 | 100.0 | 100.0 | 100.0 |
| LiO2 + Na2O + K2O | 0.2 | 0.2 | 0.2 | 0.2 | 0.2 | 0.2 |
| SiO2 − ¼Al2O3 | 54.9 | 55.8 | 55.3 | 54.7 | 55.5 | 55.8 |
| RO(MgO + CaO + SrO + BaO) | 17.9 | 18.6 | 18.0 | 17.6 | 17.5 | 17.0 |
| (SiO2 + Al2O3)/(B2O3 + RO) | 4.1 | 3.9 | 4.1 | 4.2 | 4.2 | 4.3 |
| B2O3 + RO + ZnO | 19.5 | 20.3 | 19.6 | 19.2 | 19.2 | 18.7 |
| SiO2 + Al2O3 | 80.1 | 79.3 | 79.9 | 80.3 | 80.4 | 80.9 |
| B2O3/(SiO2 + Al2O3) | 0.02 | 0.02 | 0.02 | 0.02 | 0.02 | 0.02 |

-continued

| | | | | | | |
|---|---|---|---|---|---|---|
| SiO2/Al2O3 | 2.97 | 3.22 | 3.06 | 2.93 | 3.03 | 3.03 |
| B2O3/RO | 0.09 | 0.09 | 0.09 | 0.09 | 0.09 | 0.10 |
| BaO/RO | 0.50 | 0.50 | 0.50 | 0.50 | 0.48 | 0.46 |
| 3 × BaO/MgO + CaO + SrO | 2.97 | 2.97 | 2.97 | 2.97 | 2.79 | 2.55 |
| CaO/RO | 0.23 | 0.23 | 0.23 | 0.23 | 0.22 | 0.24 |
| MgO/(RO + ZnO) | 0.17 | 0.17 | 0.17 | 0.17 | 0.18 | 0.20 |
| SrO/CaO | 0.45 | 0.45 | 0.45 | 0.45 | 0.53 | 0.45 |
| (SiO2 + Al2O3)/(B2O3 + RO + 10 × R2O) | 3.68 | 3.51 | 3.65 | 3.73 | 3.74 | 3.85 |
| SiO2 − Al2O3 + MgO + CaO − SrO − BaO | 36.1 | 38.0 | 36.9 | 35.8 | 37.0 | 38.5 |
| Devitrification Temperature | 1223 | 1199 | 1206 | 1246 | 1204 | 1195 |
| Tg(° C.) | 793 | 787 | 793 | 793 | 792 | 793 |
| Strain Point(° C.) | 742 | 736 | 741 | 741 | 742 | 742 |
| α (×10−7) (100-300° C.) | 41 | 42 | 41 | 41 | 40 | 38 |
| Density (g/cm^3) | 2.63 | 2.63 | 2.62 | 2.63 | 2.62 | 2.60 |
| Heat Shrinkage Rate | 6 | 7 | 6 | 6 | 6 | 5 |
| Etching Rate (μm/h) | 81 | 77 | 79 | 81 | 80 | 79 |

Table 1-9

| wt % | Example 49 | Example 50 | Example 51 | Example 52 | Example 53 | Example 54 |
|---|---|---|---|---|---|---|
| SiO2 | 60.4 | 60.3 | 60.6 | 60.8 | 61.0 | 61.1 |
| Al2O3 | 19.9 | 19.9 | 20.0 | 18.5 | 20.0 | 19.3 |
| B2O3 | 1.6 | 1.6 | 1.6 | 1.5 | 1.5 | 1.5 |
| Na2O | 0.0 | 0.0 | 0.0 | 0.0 | 0.0 | 0.0 |
| K2O | 0.2 | 0.2 | 0.2 | 0.2 | 0.2 | 0.2 |
| MgO | 3.3 | 3.2 | 3.1 | 3.1 | 2.9 | 3.0 |
| CaO | 3.6 | 3.6 | 3.9 | 3.3 | 3.8 | 4.0 |
| SrO | 1.8 | 2.1 | 2.5 | 3.3 | 1.8 | 1.8 |
| BaO | 8.8 | 8.8 | 7.8 | 9.1 | 8.5 | 8.8 |
| ZnO | 0.0 | 0.0 | 0.0 | 0.0 | 0.0 | 0.0 |
| ZrO2 | 0.0 | 0.0 | 0.0 | 0.0 | 0.0 | 0.0 |
| Sb2O3 | 0.0 | 0.0 | 0.0 | 0.0 | 0.0 | 0.0 |
| SnO2 | 0.2 | 0.2 | 0.2 | 0.2 | 0.2 | 0.2 |
| Fe2O3 | 0.000 | 0.000 | 0.000 | 0.000 | 0.000 | 0.000 |
| Total | 100.0 | 100.0 | 100.0 | 100.0 | 100.0 | 100.0 |
| LiO2 + Na2O + K2O | 0.2 | 0.2 | 0.2 | 0.2 | 0.2 | 0.2 |
| SiO2 − ¼Al2O3 | 55.4 | 55.4 | 55.6 | 56.2 | 56.0 | 56.3 |
| RO(MgO + CaO + SrO + BaO) | 17.6 | 17.7 | 17.4 | 18.8 | 17.0 | 17.6 |
| (SiO2 + Al2O3)/(B2O3 + RO) | 4.2 | 4.2 | 4.2 | 3.9 | 4.4 | 4.2 |
| B2O3 + RO + ZnO | 19.2 | 19.3 | 19.0 | 20.3 | 18.5 | 19.2 |
| SiO2 + Al2O3 | 80.4 | 80.2 | 80.6 | 79.3 | 81.0 | 80.4 |
| B2O3/(SiO2 + Al2O3) | 0.02 | 0.02 | 0.02 | 0.02 | 0.02 | 0.02 |
| SiO2/Al2O3 | 3.03 | 3.03 | 3.03 | 3.29 | 3.05 | 3.17 |
| B2O3/RO | 0.09 | 0.09 | 0.09 | 0.08 | 0.09 | 0.09 |
| BaO/RO | 0.50 | 0.50 | 0.45 | 0.48 | 0.50 | 0.50 |
| 3 × BaO/MgO + CaO + SrO | 3.01 | 2.96 | 2.44 | 2.80 | 3.00 | 3.00 |
| CaO/RO | 0.21 | 0.21 | 0.22 | 0.18 | 0.23 | 0.23 |
| MgO/(RO + ZnO) | 0.19 | 0.18 | 0.18 | 0.16 | 0.17 | 0.17 |
| SrO/CaO | 0.50 | 0.56 | 0.65 | 1.00 | 0.46 | 0.46 |
| (SiO2 + Al2O3)/(B2O3 + RO + 10 × R2O) | 3.74 | 3.71 | 3.78 | 3.51 | 3.88 | 3.74 |
| SiO2 − Al2O3 + MgO + CaO − SrO − BaO | 36.8 | 36.4 | 37.3 | 36.4 | 37.5 | 38.1 |
| Devitrification Temperature | 1184 | 1202 | 1234 | 1234 | 1222 | 1180 |
| Tg(° C.) | 794 | 790 | 791 | 791 | 792 | 792 |
| Strain Point(° C.) | 742 | 740 | 739 | 740 | 742 | 737 |
| α (×10−7) (100-300° C.) | 40 | 40 | 41 | 42 | 39 | 42 |
| Density (g/cm^3) | 2.63 | 2.63 | 2.62 | 2.64 | 2.62 | 2.62 |
| Heat Shrinkage Rate | 6 | 6 | 6 | 6 | 6 | 6 |
| Etching Rate (μm/h) | 79 | 80 | 79 | 76 | 77 | 76 |

Table 1-10

| wt % | Example 55 | Example 56 | Example 57 | Example 58 | Example 59 | Example 60 |
|---|---|---|---|---|---|---|
| SiO2 | 60.0 | 60.6 | 60.9 | 59.6 | 61.1 | 61.6 |
| Al2O3 | 19.9 | 19.3 | 19.6 | 19.5 | 20.0 | 20.2 |
| B2O3 | 1.5 | 1.5 | 1.2 | 1.5 | 1.5 | 1.5 |
| Na2O | 0.0 | 0.0 | 0.0 | 0.0 | 0.0 | 0.0 |
| K2O | 0.2 | 0.2 | 0.2 | 0.2 | 0.2 | 0.2 |
| MgO | 3.1 | 3.1 | 3.3 | 2.3 | 2.9 | 2.9 |
| CaO | 4.1 | 4.1 | 3.5 | 3.3 | 4.1 | 4.1 |
| SrO | 1.9 | 1.9 | 1.5 | 1.5 | 1.4 | 2.9 |

-continued

| | | | | | | |
|---|---|---|---|---|---|---|
| BaO | 9.1 | 9.1 | 9.5 | 11.9 | 8.4 | 6.4 |
| ZnO | 0.0 | 0.0 | 0.0 | 0.0 | 0.0 | 0.0 |
| ZrO2 | 0.0 | 0.0 | 0.0 | 0.0 | 0.0 | 0.0 |
| Sb2O3 | 0.0 | 0.0 | 0.0 | 0.0 | 0.0 | 0.0 |
| SnO2 | 0.2 | 0.2 | 0.2 | 0.2 | 0.2 | 0.2 |
| Fe2O3 | 0.000 | 0.000 | 0.000 | 0.000 | 0.000 | 0.000 |
| Total | 100.0 | 100.0 | 100.0 | 100.0 | 100.0 | 100.0 |
| LiO2 + Na2O + K2O | 0.2 | 0.2 | 0.2 | 0.2 | 0.2 | 0.2 |
| SiO2 − ¼Al2O3 | 55.0 | 55.8 | 56.0 | 54.7 | 56.1 | 56.5 |
| RO(MgO + CaO + SrO + BaO) | 18.1 | 18.2 | 17.8 | 19.0 | 16.8 | 16.3 |
| (SiO2 + Al2O3)/(B2O3 + RO) | 4.1 | 4.1 | 4.2 | 3.9 | 4.4 | 4.6 |
| B2O3 + RO + ZnO | 19.6 | 19.7 | 19.0 | 20.5 | 18.4 | 17.8 |
| SiO2 + Al2O3 | 79.9 | 79.8 | 80.5 | 79.1 | 81.2 | 81.7 |
| B2O3/(SiO2 + Al2O3) | 0.02 | 0.02 | 0.02 | 0.02 | 0.02 | 0.02 |
| SiO2/Al2O3 | 3.01 | 3.14 | 3.11 | 3.05 | 3.05 | 3.05 |
| B2O3/RO | 0.08 | 0.08 | 0.07 | 0.08 | 0.09 | 0.09 |
| BaO/RO | 0.50 | 0.50 | 0.53 | 0.63 | 0.50 | 0.39 |
| 3 × BaO/MgO + CaO + SrO | 3.00 | 3.00 | 3.44 | 5.05 | 3.00 | 1.93 |
| CaO/RO | 0.23 | 0.23 | 0.20 | 0.17 | 0.24 | 0.25 |
| MgO/(RO + ZnO) | 0.17 | 0.17 | 0.19 | 0.12 | 0.17 | 0.18 |
| SrO/CaO | 0.46 | 0.46 | 0.43 | 0.45 | 0.35 | 0.70 |
| (SiO2 + Al2O3)/(B2O3 + RO + 10 × R2O) | 3.64 | 3.63 | 3.77 | 3.48 | 3.92 | 4.06 |
| SiO2 − Al2O3 + MgO + CaO − SrO − BaO | 36.2 | 37.5 | 37.1 | 32.3 | 38.2 | 39.2 |
| Devitrification Temperature | 1200 | 1200 | 1214 | 1241 | 1206 | 1231 |
| Tg(° C.) | 786 | 787 | 793 | 790 | 791 | 789 |
| Strain Point(° C.) | 735 | 736 | 741 | 739 | 739 | 738 |
| α (×10-7) (100-300° C.) | 41 | 41 | 39 | 42 | 41 | 41 |
| Density (g/cm^3) | 2.64 | 2.63 | 2.62 | 2.65 | 2.60 | 2.59 |
| Heat Shrinkage Rate | 6 | 6 | 6 | 7 | 6 | 6 |
| Etching Rate (μm/h) | 80 | 77 | 77 | 76 | 77 | 77 |

Table 1-11

| wt % | Example 61 | Example 62 | Example 63 |
|---|---|---|---|
| SiO2 | 61.7 | 60.6 | 61.5 |
| Al2O3 | 20.2 | 19.9 | 20.2 |
| B2O3 | 1.5 | 1.5 | 1.5 |
| Na2O | 0.0 | 0.0 | 0.0 |
| K2O | 0.2 | 0.2 | 0.2 |
| MgO | 2.9 | 2.2 | 2.7 |
| CaO | 4.1 | 4.1 | 3.8 |
| SrO | 1.4 | 1.5 | 4.5 |
| BaO | 6.4 | 8.4 | 5.3 |
| ZnO | 1.3 | 1.3 | 0.0 |
| ZrO2 | 0.0 | 0.0 | 0.0 |
| Sb2O3 | 0.0 | 0.0 | 0.0 |
| SnO2 | 0.2 | 0.2 | 0.2 |
| Fe2O3 | 0.000 | 0.000 | 0.000 |
| Total | 100.0 | 100.0 | 100.0 |
| LiO2 + Na2O + K2O | 0.2 | 0.2 | 0.2 |
| SiO2 − ¼Al2O3 | 56.6 | 55.6 | 56.4 |
| RO(MgO + CaO + SrO + BaO) | 14.9 | 16.2 | 16.4 |
| (SiO2 + Al2O3)/(B2O3 + RO) | 5.0 | 4.5 | 4.6 |
| B2O3 + RO + ZnO | 17.7 | 19.1 | 17.9 |
| SiO2 + Al2O3 | 81.9 | 80.5 | 81.6 |
| B2O3/(SiO2 + Al2O3) | 0.02 | 0.02 | 0.02 |
| SiO2/Al2O3 | 3.05 | 3.05 | 3.05 |
| B2O3/RO | 0.10 | 0.09 | 0.09 |
| BaO/RO | 0.43 | 0.52 | 0.32 |
| 3 × BaO/MgO + CaO + SrO | 2.25 | 3.24 | 1.41 |
| CaO/RO | 0.28 | 0.25 | 0.23 |
| MgO/(RO + ZnO) | 0.18 | 0.13 | 0.17 |
| SrO/CaO | 0.35 | 0.36 | 1.18 |
| (SiO2 + Al2O3)/(B2O3 + RO + 10 × R2O) | 4.37 | 4.01 | 4.03 |
| SiO2 − Al2O3 + MgO + CaO − SrO − BaO | 40.7 | 37.1 | 38.1 |
| Devitrification Temperature | 1253 | 1237 | 1249 |
| Tg(° C.) | 788 | 787 | 788 |
| Strain Point(° C.) | 737 | 735 | 737 |
| α (×10-7) (100-300° C.) | 42 | 41 | 42 |
| Density (g/cm^3) | 2.59 | 2.63 | 2.60 |

| | | | |
|---|---|---|---|
| Heat Shrinkage Rate | 6 | 6 | 6 |
| Etching Rate (μm/h) | 78 | 76 | 77 |

Raw materials for respective components were blended so as to have the glass compositions indicated in Table 1 and melting, refining and forming were performed.

Examples 1 to 63 among glasses obtained as above had a devitrification temperature of 1260° C. or lower and a strain point of 720° C. or higher (examples of the glass substrate according to claim 2). Among these, Examples 1 to 6, 9, 15 to 18, 21, 25, 29 to 31, 34 to 45, 47 to 57, 59 and 60 had a devitrification temperature of 1235° C. or lower and a strain point of 720° C. or higher (examples of the glass substrate according to claim 1). Similar results were obtained when glass raw materials were melted by employing direct electrical heating and glass substrates were produced by overflow down-draw processing. Therefore, with the glasses, glass substrates may be produced by overflow down-draw processing, which may be used for displays to which LTPS-TFTs are applied. The glass substrates are also suitable as glass substrates for OS-TFTs.

The invention claimed is:

1. A glass substrate for a display composed of a glass, the glass comprising $SiO_2$ and $Al_2O_3$, wherein the $Al_2O_3$ content is in a range of 16 to 35% by mass; and
the glass further comprising, in % by mass,
$B_2O_3$ at greater than 0% and less than 3%; and
$Li_2O$ in the range of 0 to 0.5%, and
$Na_2O$ in the range of 0 to 0.5%, and
$K_2O$ in the range of 0.1 to 0.8%, and
wherein a mass ratio ($B_2O_3$/RO) is in the range of 0.03 to 0.5,
the mass ratio (MgO/(RO+ZnO)) is in the range of 0.17 to 0.8,
RO represents MgO+CaO+SrO+BaO, and
the glass is devoid of $Sb_2O_3$, $ZrO_2$, and $TiO_2$,
has a devitrification temperature of 1180° C. to 1235° C., and
has a strain point of 720° C. to 750° C.

2. The glass substrate according to claim 1, wherein the glass substrate has a heat shrinkage rate of 15 ppm or less, the heat shrinkage rate being represented by the following formula when the glass substrate is kept at a temperature of 500° C. for 30 minutes followed by cooling to normal temperature:

Heat shrinkage rate (ppm)={Amount of shrinkage of glass before and after heat treatment/Length of glass before heat treatment}×$10^6$.

3. The glass substrate according to claim 1, wherein the glass substrate has an etching rate of higher than 75 μm/h.

4. The glass substrate according to claim 1, which is a glass substrate for a flat panel display comprising a thin film transistor formed with a low-temperature polysilicon or an oxide semiconductor on the surface of the glass substrate.

5. The glass substrate according to claim 2, wherein the glass substrate has an etching rate of higher than 75 μm/h.

6. The glass substrate according to claim 5, which is a glass substrate for a flat panel display comprising a thin film transistor formed with a low-temperature polysilicon or an oxide semiconductor on the surface of the glass substrate.

7. The glass substrate according to claim 3, which is a glass substrate for a flat panel display comprising a thin film transistor formed with a low-temperature polysilicon or an oxide semiconductor on the surface of the glass substrate.

8. The glass substrate according to claim 1, wherein the glass comprises 1.0% or less of $Li_2O$, $Na_2O$ and $K_2O$ in total.

9. The glass substrate according to claim 1, wherein the $B_2O_3$ content is 2.8% or less.

10. The glass substrate according to claim 1, wherein the mass ratio ($SiO_2$/$Al_2O_3$) is in the range of 3.00 to 4.5.

11. The glass substrate according to claim 1, wherein the mass ratio (MgO/(RO+ZnO)) is in the range of 0.18 to 0.8.

12. The glass substrate according to claim 1, wherein the mass ratio (CaO/RO) is in the range of 0 to 0.28.

* * * * *